United States Patent
Chen et al.

(10) Patent No.: US 9,508,637 B2
(45) Date of Patent: Nov. 29, 2016

(54) PROTRUSION BUMP PADS FOR BOND-ON-TRACE PROCESSING

(71) Applicant: Taiwan Semiconductor Manufacturing Company, Ltd., Hsin-Chu (TW)

(72) Inventors: Chen-Shien Chen, Zhubei (TW); Yu-Feng Chen, Hsin-Chu (TW); Yu-Wei Lin, New Taipei (TW); Tin-Hao Kuo, Hsin-Chu (TW); Yu-Min Liang, Zhongli (TW); Chun-Hung Lin, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 24 days.

(21) Appl. No.: 14/456,812

(22) Filed: Aug. 11, 2014

(65) Prior Publication Data

US 2015/0194379 A1    Jul. 9, 2015

Related U.S. Application Data

(63) Continuation-in-part of application No. 14/453,858, filed on Aug. 7, 2014, and a continuation-in-part of application No. 14/148,482, filed on Jan. 6, 2014, now Pat. No. 9,275,967.

(51) Int. Cl.
*H01L 21/00* (2006.01)
*H01L 23/498* (2006.01)
*H01L 21/48* (2006.01)

(52) U.S. Cl.
CPC ....... *H01L 23/49838* (2013.01); *H01L 21/486* (2013.01); *H01L 23/49811* (2013.01); *H01L 2224/81* (2013.01)

(58) Field of Classification Search
CPC .......... H01L 21/486; H01L 23/49811; H01L 23/49838
See application file for complete search history.

(56) References Cited

U.S. PATENT DOCUMENTS

| | | |
|---|---|---|
| 5,892,277 A | 4/1999 | Ikemizu et al. |
| 6,087,251 A | 7/2000 | Hsu |
| 6,348,398 B1 | 2/2002 | Wang |
| 6,352,916 B1 | 3/2002 | Tang et al. |
| 6,388,322 B1 | 5/2002 | Goossen et al. |
| 6,465,886 B1 | 10/2002 | Horiuchi et al. |
| 6,627,824 B1 | 9/2003 | Lin |
| 6,797,615 B1 | 9/2004 | Lous et al. |
| 6,951,773 B2 | 10/2005 | Ho et al. |
| 7,112,524 B2 | 9/2006 | Hsu et al. |
| 8,127,979 B1 | 3/2012 | Wu et al. |

(Continued)

FOREIGN PATENT DOCUMENTS

| | | |
|---|---|---|
| CN | 102054811 | 5/2011 |
| TW | 200408080 A | 10/2004 |

(Continued)

*Primary Examiner* — Richard Booth
(74) *Attorney, Agent, or Firm* — Slater Matsil, LLP

(57) ABSTRACT

An embodiment apparatus includes a dielectric layer in a die, a conductive trace in the dielectric layer, and a protrusion bump pad on the conductive trace. The protrusion bump pad at least partially extends over the dielectric layer, and the protrusion bump pad includes a lengthwise axis and a widthwise axis. A ratio of a first dimension of the lengthwise axis to a second dimension of the widthwise axis is about 0.8 to about 1.2.

20 Claims, 22 Drawing Sheets

(56) References Cited

U.S. PATENT DOCUMENTS

| | | |
|---|---|---|
| 8,198,140 B2 | 6/2012 | Murai et al. |
| 8,318,537 B2 | 11/2012 | Pendse |
| 8,952,538 B2 | 2/2015 | Matsuki |
| 2002/0048944 A1 | 4/2002 | Tang et al. |
| 2002/0187585 A1 | 12/2002 | Tsukada et al. |
| 2009/0020323 A1* | 1/2009 | Chen ............ H01L 23/49816 174/257 |
| 2009/0121349 A1 | 5/2009 | Suzuki |
| 2011/0101526 A1 | 5/2011 | Hsiao et al. |
| 2011/0133334 A1 | 6/2011 | Pendse |
| 2011/0217842 A1 | 9/2011 | Park et al. |
| 2012/0098120 A1 | 4/2012 | Yu et al. |
| 2012/0175774 A1 | 7/2012 | West et al. |
| 2013/0328189 A1 | 12/2013 | Pendse |
| 2014/0035095 A1 | 2/2014 | Lin et al. |
| 2014/0151867 A1 | 6/2014 | Lin et al. |

FOREIGN PATENT DOCUMENTS

| | | |
|---|---|---|
| TW | 200625559 | 7/2006 |
| TW | 201115700 A | 5/2011 |
| TW | 201208024 | 2/2012 |
| TW | 201220989 A | 5/2012 |
| TW | 201246466 | 11/2012 |
| TW | 201304026 A1 | 1/2013 |
| TW | M462949 U | 10/2013 |

* cited by examiner

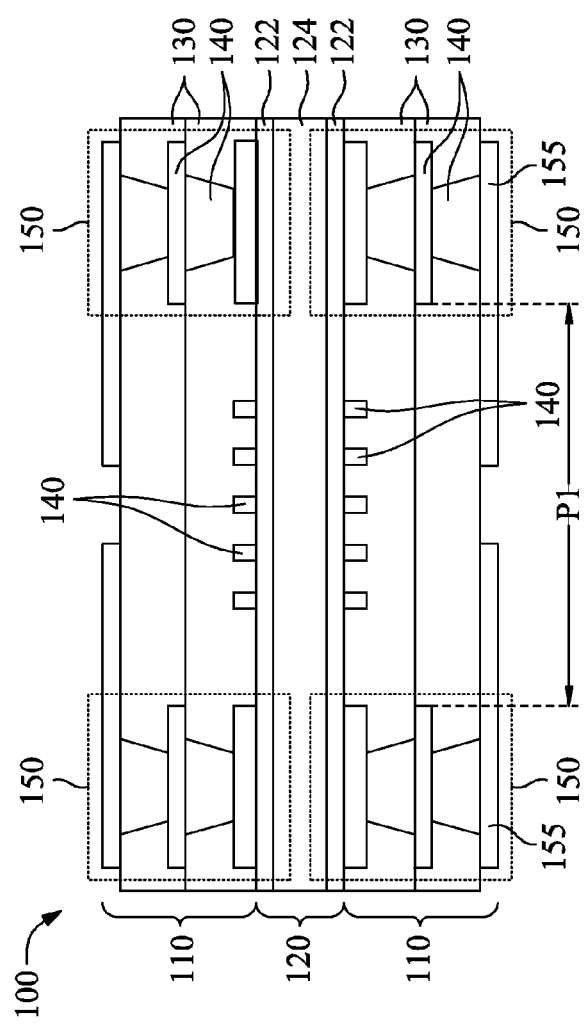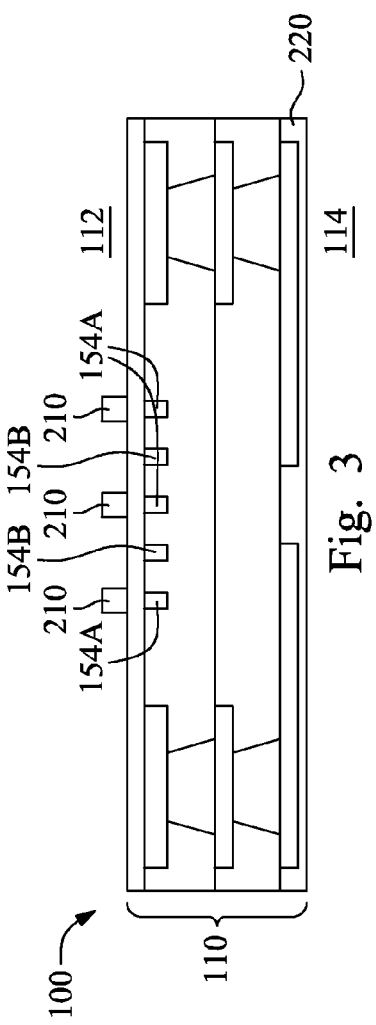

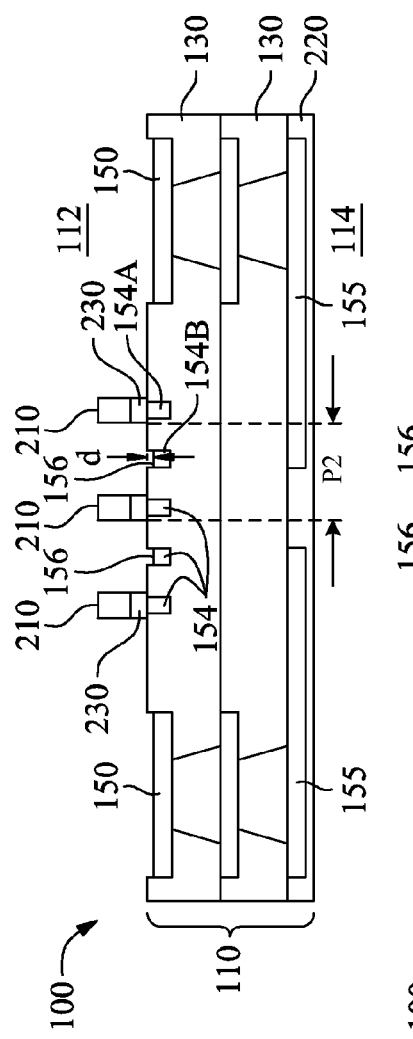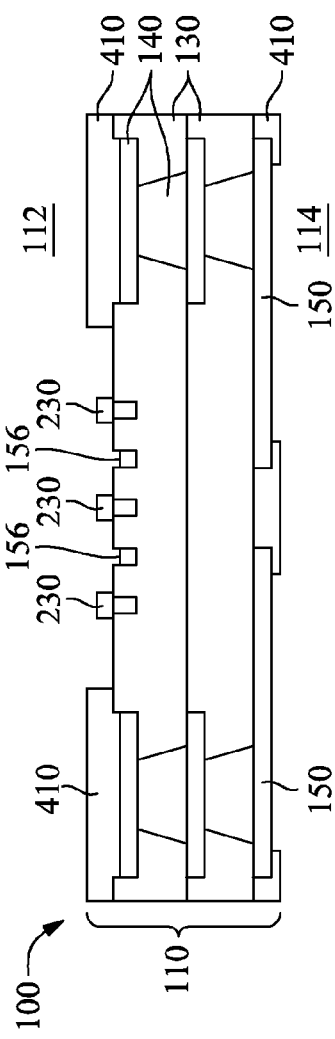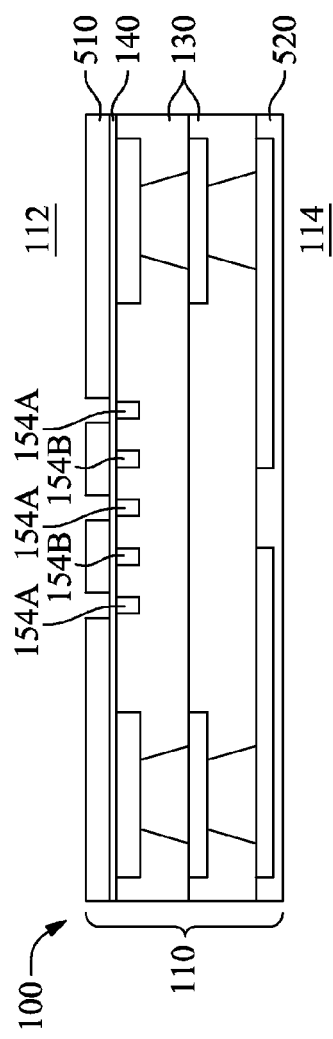

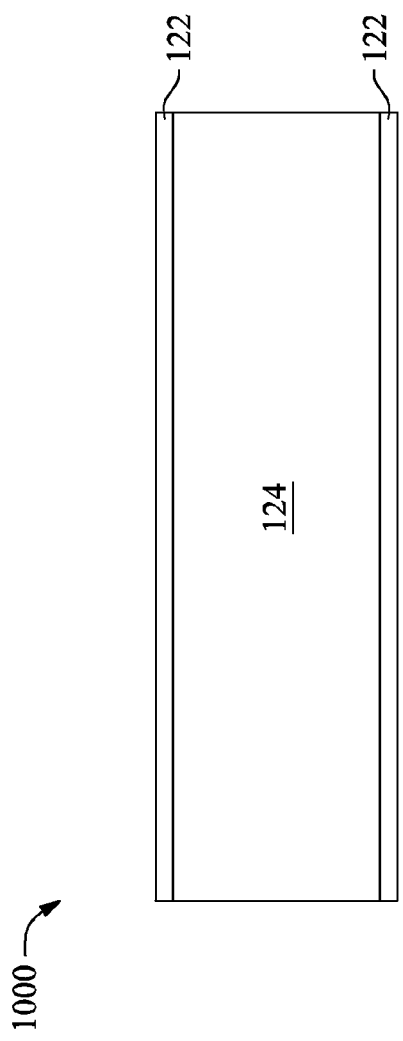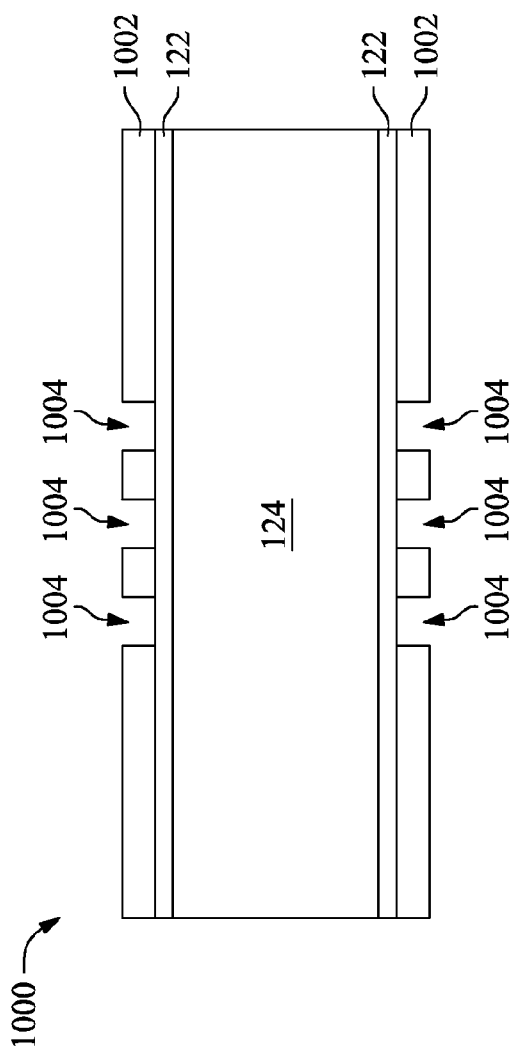

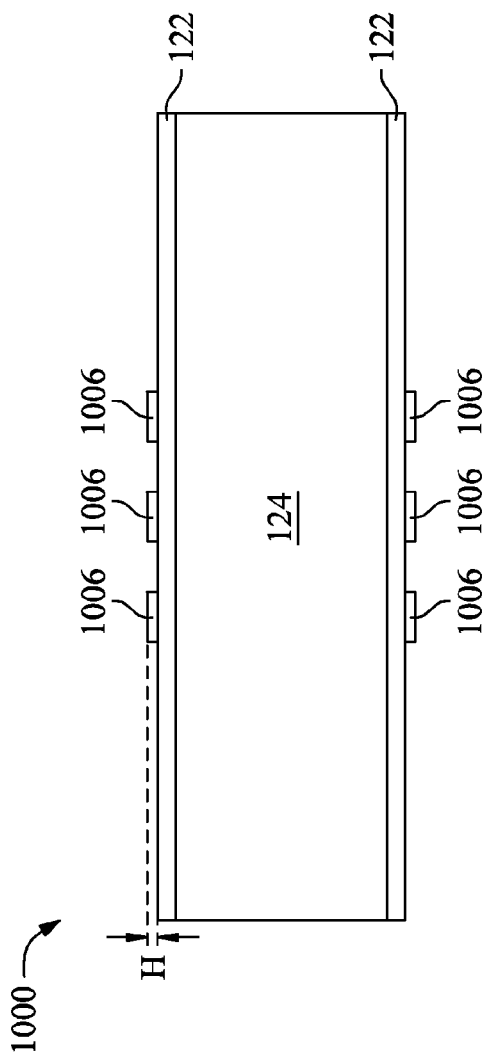
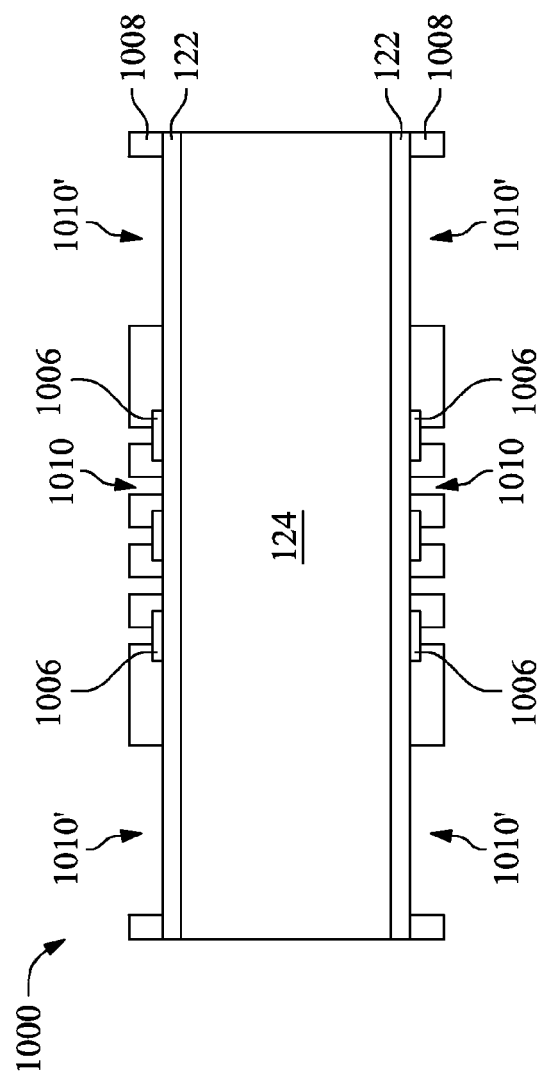

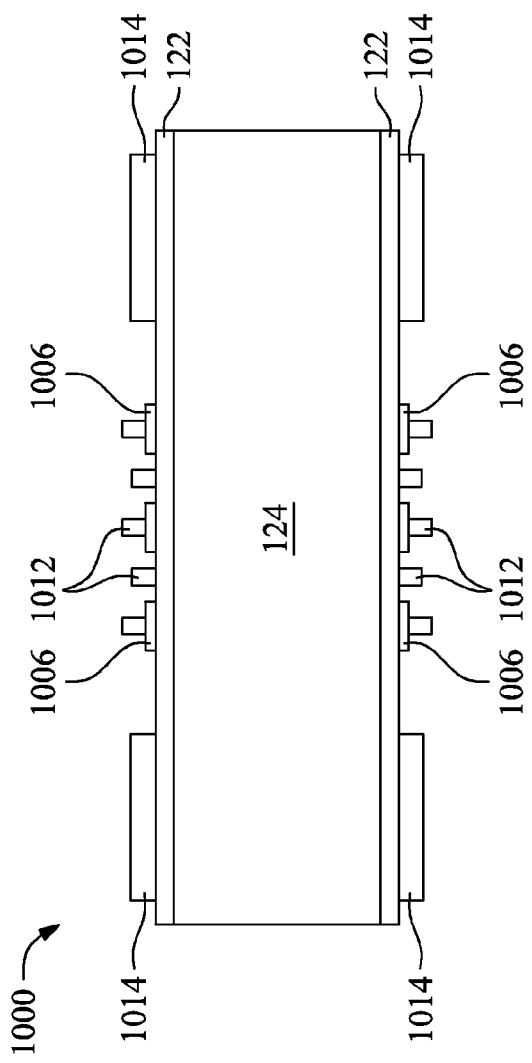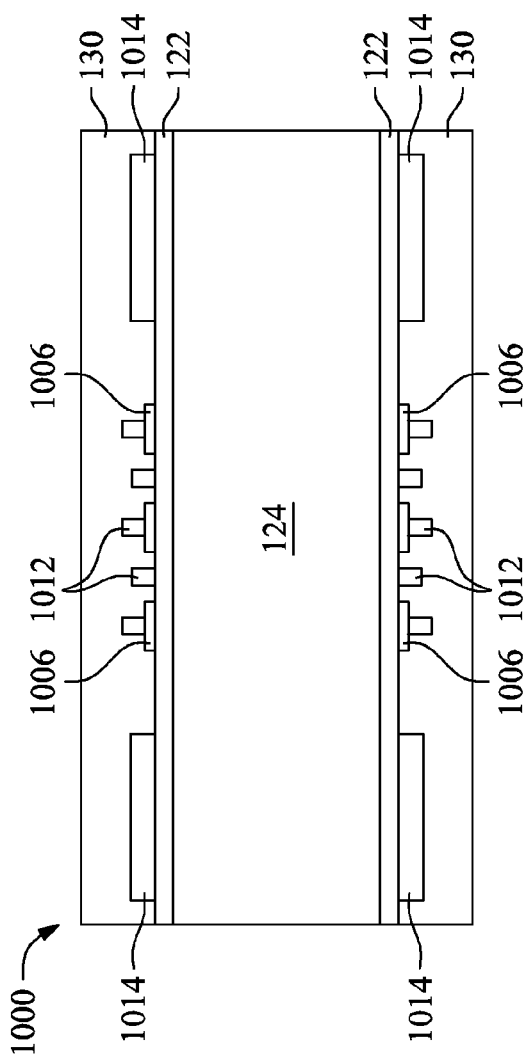

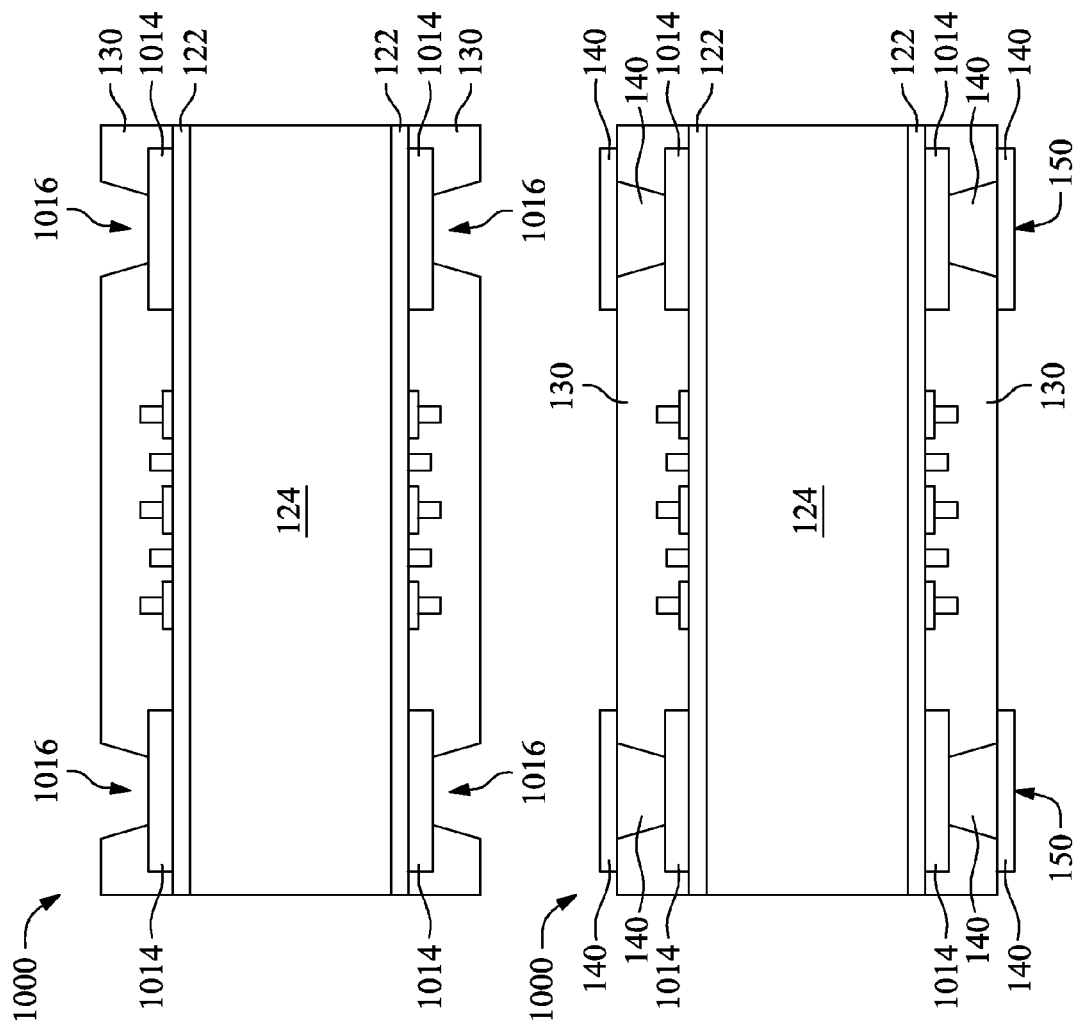

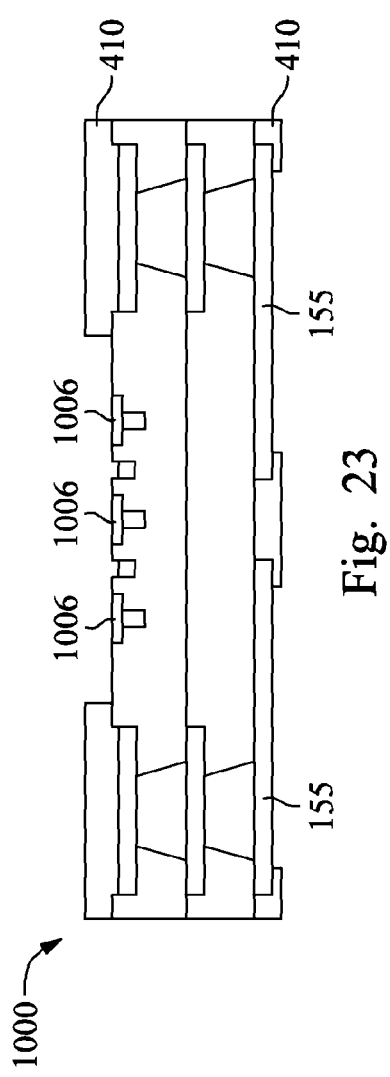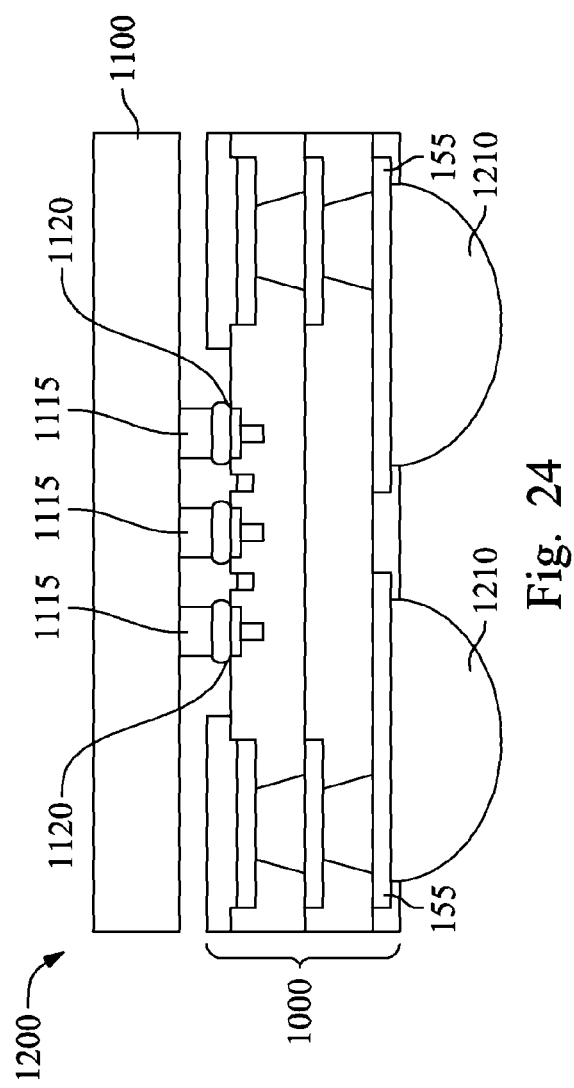

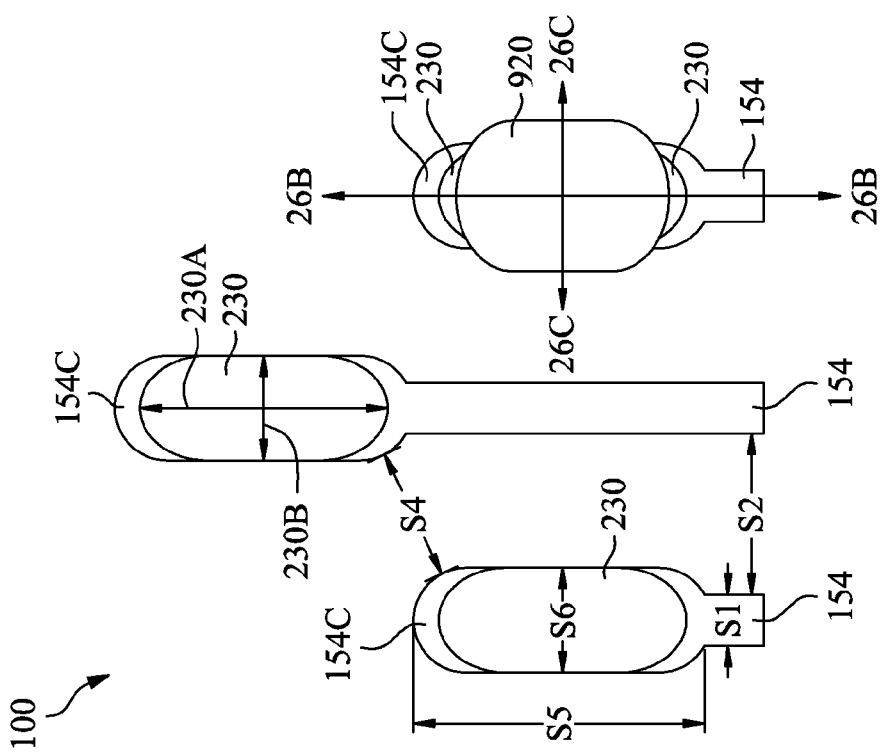
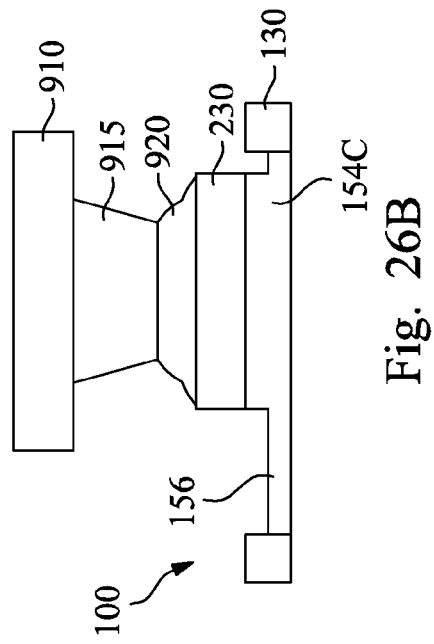
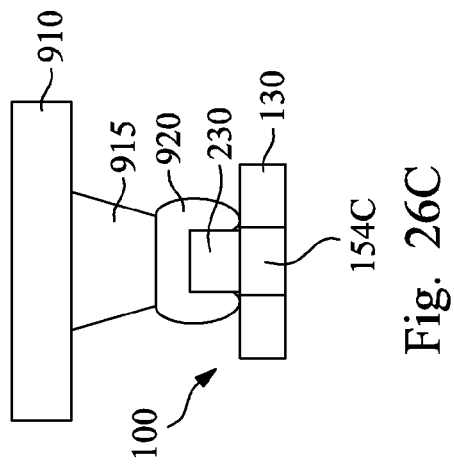
Fig. 26A
Fig. 26B
Fig. 26C

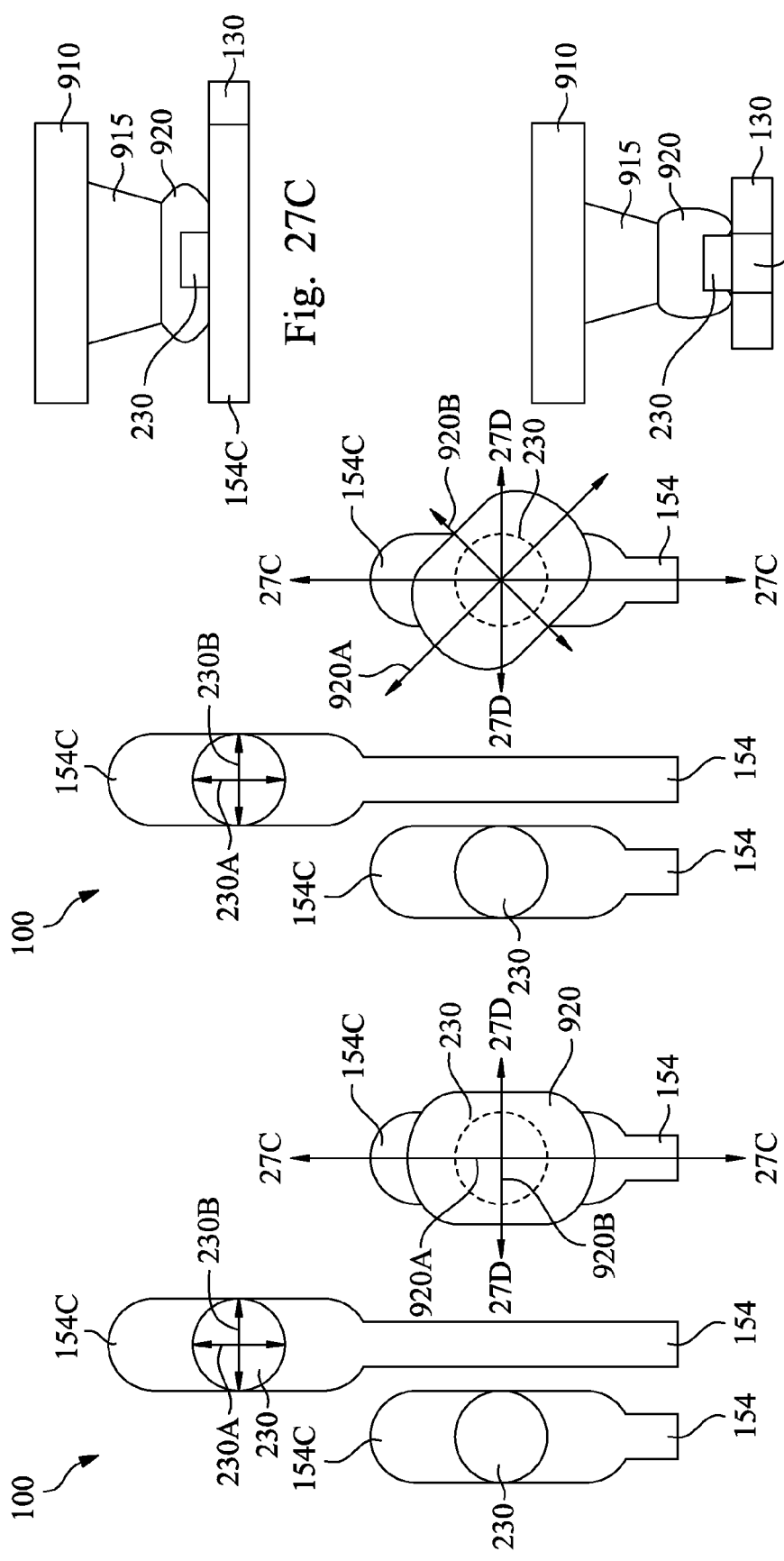

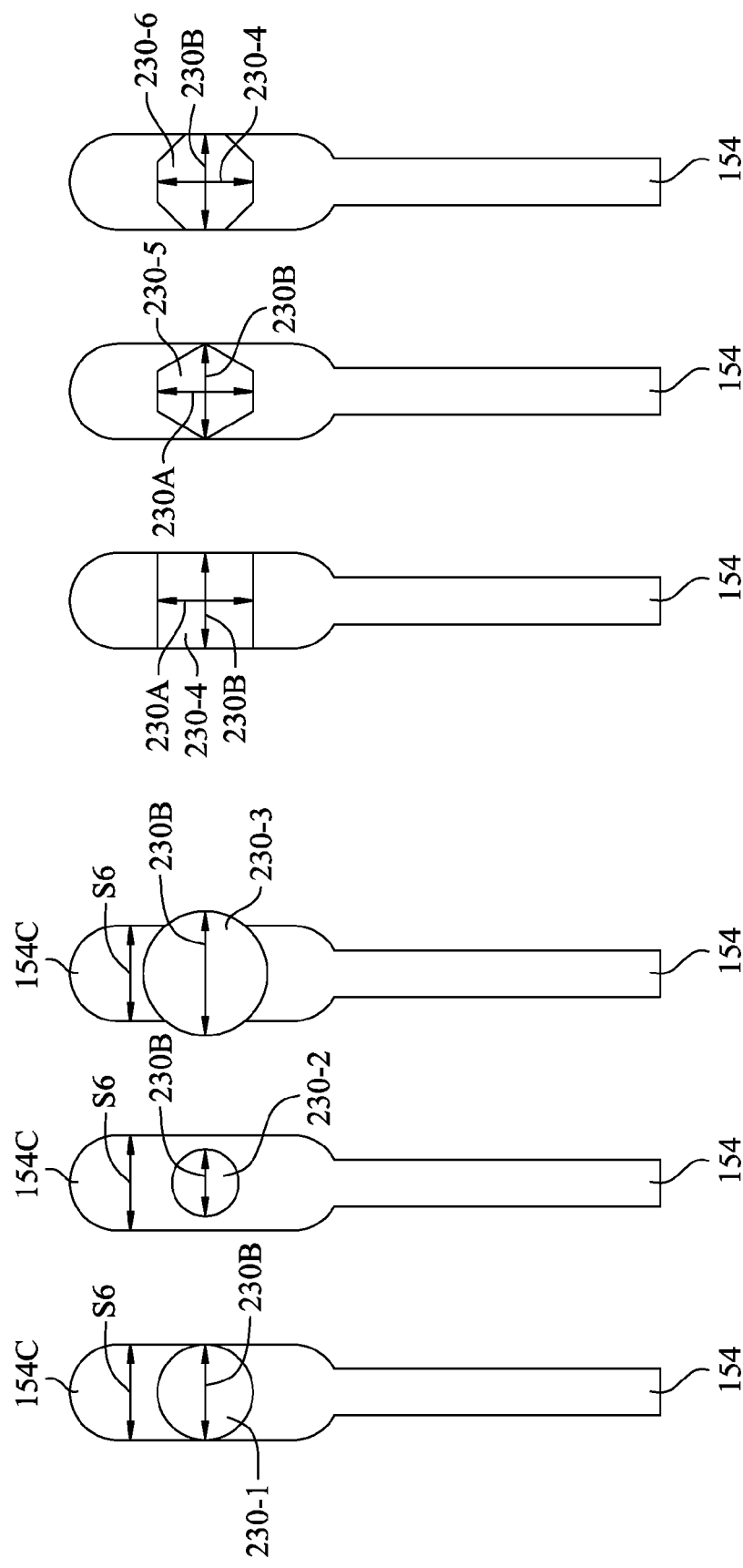

PROTRUSION BUMP PADS FOR BOND-ON-TRACE PROCESSING

This application is a continuation-in-part of application Ser. No. 14/148,482, filed on Jan. 6, 2014, "Protrusion Bump Pads for Bond-on-Trace Processing" and application Ser. No. 14/453,858, filed on Aug. 7, 2014, "Protrusion Bump Pads for Bond-on-Trace Processing," which applications are hereby incorporated herein by reference.

BACKGROUND

In Bond-on-Trace (BoT) processing, a singulated, integrated circuit (IC) chip is flipped and connected to bond pad portions of traces formed on another substrate. A subset of the traces, also known as skip lines, includes traces extending between the bond pad portions, such as for fan-out purposes. Thus, the trace pitch is less than the bond pad pitch. However, this resulted in solder bonds inadvertently bridging connections with adjacent traces, and made probe testing overly challenging as the trace pitch fell below the diameter of common testing probes.

SUMMARY OF THE INVENTION

The present disclosure introduces a method comprising separating a substrate from a carrier on which an additional substrate is formed. The separated substrate comprises a conductive layer on a top surface of the substrate and a plurality of conductive pillars each extending from a bottom surface of the substrate and through the substrate to the conductive layer. A protrusion bump pad is formed over each of a first subset of the conductive pillars by selectively removing the conductive layer except from over each of the first subset of conductive pillars.

The present disclosure also introduces an apparatus comprising a substrate and a plurality of conductive traces on a first side of the substrate. Conductive pillars extend through the substrate from a second side of the substrate to corresponding ones of the conductive traces. Bump pads protrude from a first subset of the conductive traces, whereas each of a second subset of the conductive traces is recessed within the first side of the substrate.

The present disclosure also introduces a method comprising providing a die and a substrate, wherein the die comprises at least one integrated circuit chip, and the substrate comprises first and second subsets of conductive pillars extending therethrough. Each of the first subset of conductive pillars comprises a protrusion bump pad protruding from a surface of the substrate, and the second subset of conductive pillars each partially form a trace recessed within the surface of the substrate. The die is then coupled to the substrate via a plurality of conductive bumps each extending between one of the protrusion bump pads and the die.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 2 is a sectional view of at least a portion of apparatus in an intermediate stage of manufacture according to one or more aspects of the present disclosure.

FIG. 3 is a sectional view of the apparatus shown in FIG. 2 in a subsequent stage of manufacture according to one or more aspects of the present disclosure.

FIG. 4 is a sectional view of the apparatus shown in FIG. 3 in a subsequent stage of manufacture according to one or more aspects of the present disclosure.

FIG. 5 is a sectional view of the apparatus shown in FIG. 4 in a subsequent stage of manufacture according to one or more aspects of the present disclosure.

FIG. 6 is a sectional view of the apparatus shown in FIG. 2 in a subsequent stage of manufacture according to one or more aspects of the present disclosure.

FIGS. 11-24 are sectional views of various intermediate stages of manufacturing a device in accordance with some embodiments.

FIGS. 26A-26C are varying views of an apparatus in accordance with some embodiments.

FIGS. 27A-27D are varying views of an apparatus in accordance with some other embodiments.

FIGS. 28-31B are top down views of an apparatus in accordance with some embodiments.

DETAILED DESCRIPTION OF ILLUSTRATIVE EMBODIMENTS

Figure 1A:
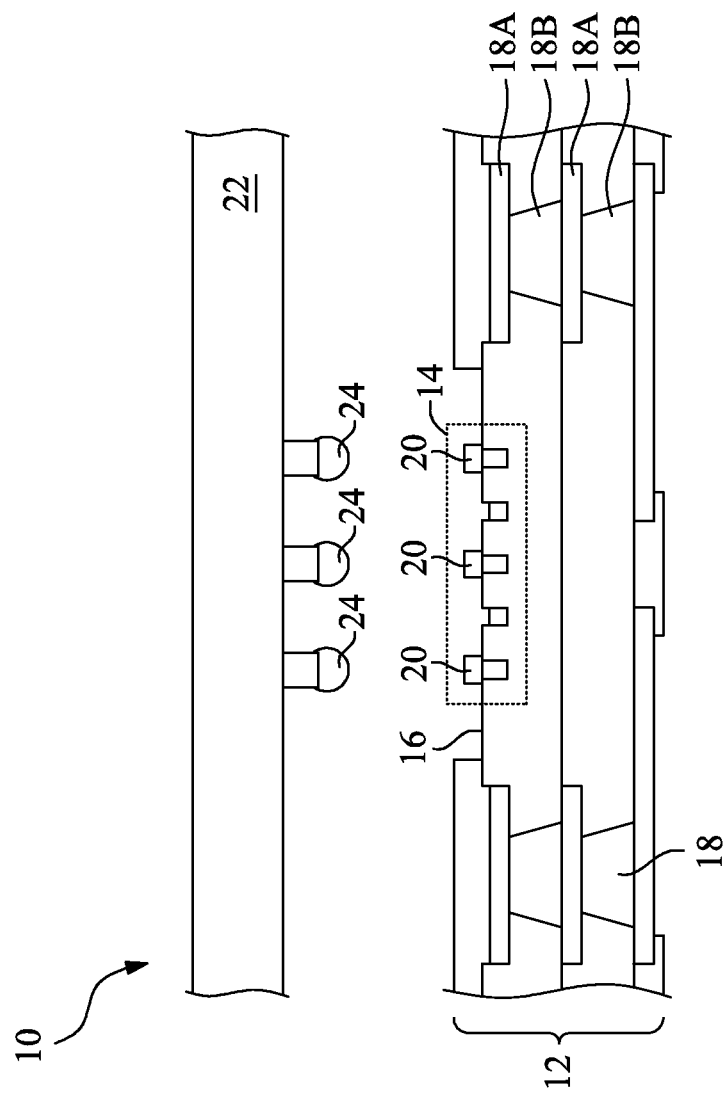
FIGS. 1A and 1B are sectional and top down views of at least a portion of apparatus according to one or more aspects of the present disclosure.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

FIG. 1A is a sectional view of at least a portion of an apparatus 10 in an intermediate stage of manufacture according to one or more aspects of the present disclosure. The apparatus 10 comprises a substrate 12 and a plurality of conductive traces 14 disposed on a side 16 of the substrate.

Conductive members 18 may extend into the substrate 12. Conductive members 18 may include conductive vias 18B and contact pads 18A disposed on conductive vias 18B. Conductive traces 14 may be physically connected to ones of contact pads 18A, which is more readily apparent in the top down view of side 16 of substrate 12 illustrated by FIG. 1B. Bump pads 20 each protrude from conductive traces 14. Portions of conductive traces 14 not covered by bump pads 20 are recessed within the side 16 of the substrate 12. The apparatus 10 may further comprise an integrated circuit chip 22 and a plurality of conductive bumps 24 coupled between the integrated circuit chip and corresponding ones of the bump pads 20.

Figure 1B:
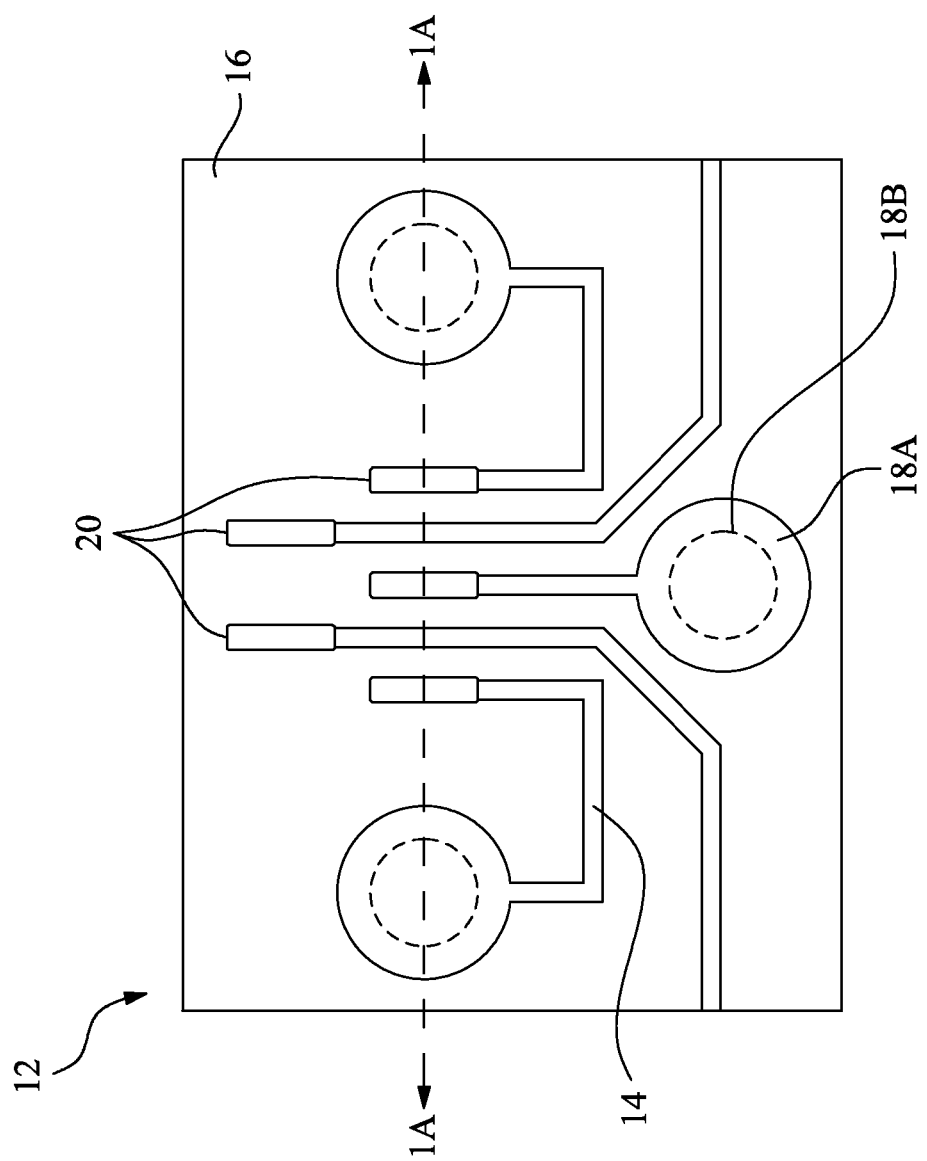

FIG. 1B illustrates a top down view of a portion of side 16 of substrate 12. The sectional view of FIG. 1A may be taken across line 1A-1A illustrated in FIG. 1B. As illustrated by FIG. 1B, bump pads 20 may be electrically connected to conductive traces 14, which may be electrically connected to contact pads 18A and conductive vias 18B (shown in ghost) of conductive members 18. Bump pads 20 may cover at least a portion of conductive traces 14. Exposed portions of conductive traces 14 may be recessed from a surface of substrate 12. Bump pads 20 may be used to electrically connect substrate 12 to other device features such as integrated circuit chip 22 or other package substrates, interposers, device dies, printed circuit boards, and the like.

FIG. 2 is a sectional view of an implementation of the apparatus 10 shown in FIG. 1, herein designated by the reference numeral 100. The apparatus 100 is depicted in FIG. 2 as being in an intermediate stage of manufacture according to one or more aspects of the present disclosure. The apparatus 100 comprises build-up layers 110 on opposing sides of a carrier substrate 120. The carrier substrate 120 may comprise one or more conductive layers 122 formed on one or both sides of a core 124. The core 124 and/or the carrier substrate 120 may comprise a single-sided or double-sided copper clad laminate (CCL), a prepreg or ajinomoto build-up film (ABF), paper, glass fiber, non-woven glass fabric, one or more layers of copper, nickel, aluminum, and/or other materials, elements, and/or compositions. The one or more conductive layers 122 may comprise one or more layers of copper, nickel, aluminum, and/or other materials.

Among other components, the build-up layers 110 may comprise multiple dielectric layers 130 and metallization layers 140. The dielectric layers 130 may comprise a prepreg or ajinomoto build-up film (ABF). Alternatively, or additionally, the dielectric layers 130 may comprise paper, glass fiber, and/non-woven glass fabric, one or more of which may be applied by lamination. Alternatively, or additionally, the dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. The dielectric layers 130 may be formed by sputtering, spin-on coating, chemical vapor deposition (CVD), low-pressure CVD, rapid thermal CVD, atomic layer CVD, and/or plasma enhanced CVD, perhaps utilizing tetraethyl orthosilicate and oxygen as a precursor. The dielectric layers 130 may also be formed by an oxidation process, such as wet or dry thermal oxidation in an ambient environment comprising an oxide, water, nitric oxide, or a combination thereof, and/or other processes. Fabrication of the dielectric layers 130 may also comprise chemical-mechanical polishing or planarizing (hereafter collectively referred to as CMP), isotropic etching, and/or anisotropic etching, among other processes. The dielectric layers 130 may be formed to a thickness ranging between about eight angstroms and about 200 angstroms, although other thicknesses are also within the scope of the present disclosure.

The metallization layers 140 may comprise one or more of copper, titanium, aluminum, nickel, gold, alloys and/or combinations thereof, and/or other materials. Portions of metallization layers 140 may be vertically interconnected to form interconnect structures 150 (e.g., having contact pads, conductive lines, and or vias). Other portions of metallization layers 140 may form conductive traces 154. Conductive traces 154 may be connected to contact pad portions of interconnect structures 150 (see e.g., FIG. 1B). The metallization layers 140 may be formed by plating, perhaps to a thickness ranging between about four microns and about 25 microns. Alternatively, or additionally, the metallization layers 140 may be formed by CVD and/or other processes, and may have a thickness ranging between about eight angstroms and about 200 angstroms, although other thicknesses are also within the scope of the present disclosure.

Bond pads 155 may be disposed on interconnect structures 150. Interconnect structures 150 and/or bond pads 155 thereof may have diameter and/or other lateral dimension ranging between about 150 microns and about 400 microns. The bond pads 155 may each be a BGA (ball grid array) pad, such as may be subsequently utilized in forming an interconnection with a "mother board" PCB (printed circuit board) and/or another PCB, PWB (printed wiring board), PCA (printed circuit assembly), PCBA (PCB assembly), CCA (circuit card assembly), backplane assembly, and/or apparatus. A pitch P1, or the lateral offset between neighboring bond pads 155, may range between about 300 microns and about 500 microns.

FIG. 3 is a sectional view of the apparatus 100 shown in FIG. 2 in a subsequent stage of manufacture according to one or more aspects of the present disclosure, in which the sections of build-up layers 110 have been removed from the carrier substrate 120. One of the sections of build-up layers 110 is not shown in FIG. 3, although this is merely for the sake of simplifying the following discussion, and a person having ordinary skill in the art will readily recognize that both sections of the build-up layers 110 may be processed according to one or more of the aspects of the present disclosure. The build-up layers 110 may be removed from the carrier substrate 120 by routing, melting, mechanical force, etching and/or other processes.

A photoresist layer may then be coated, exposed, and developed on one or both sides of the build-up layers 110. For example, photoresist portions 210 may be formed on a first side 112 of the build-up layers 110, and a photoresist layer 220 may substantially cover a second side 114 of the build-up layers 110. Although FIG. 3 illustrates a particular number of interconnect structures 150 and conductive traces 154, any number of metallization layers 140 may be provided.

The photoresist portions 210 on the first side 112 of the build-up layers 110 are formed over portions of conductive traces 154 (portions 154A) while other portions of conductive traces 154 (portions 154B) may remain exposed to the subsequent lithographic processing. The photoresist portions 210 and layer 220 may comprise a chemically amplified photoresist or a non-chemically amplified photoresists, and may be positive-tone or negative tone. Processing of the photoresist portions 210 and layer 220 may comprise a deposition process including, for example, lamination of a dry film type photoresist, spin-on-coating, dip coating, brush coating, and/or ink-jet dispensing, among others. A post deposition baking step may be performed to remove solvent and/or other unwanted components, such as to a temperature ranging between about 40° C. and about 200° C., perhaps for a baking time ranging between about 10 seconds and about 10 minutes.

FIG. 4 is a sectional view of the apparatus 100 shown in FIG. 3 in a subsequent stage of manufacture according to one or more aspects of the present disclosure, in which the photoresist portions 210 over portions 154A of conductive traces 154 have been utilized as a mask during an etching process. The etching process is utilized to remove the portions of the outermost metallization layers 140 that are not protected by the photoresist portions 210 and layer 220. Thus, on the first side 112 of the build-up layers 110, the outermost metallization layer 140 is removed down to the outermost dielectric layer 130. However, the etching of the outermost metallization layer 140 over exposed portions 154B of conductive traces 154 is continued for a sufficient time so as to recess the exposed surface 156 of the conductive traces 154 within the outer surface of the outermost dielectric layer 130. The exposed surface 156 of portions 154B of conductive traces 154 thus forms a portion of a recessed trace, whereas the masked portion of each of portions 154A of conductive traces 154 forms a protrusion bump pad 230. The depth d of the recess over the recessed trace, below the surface of the surrounding dielectric layer 130, may be less than about seven microns, such as about four microns, although other depths are also within the scope of the present disclosure. A pitch P2 between adjacent protrusion bump pads 230 may be about 40 µm to about 150 µm, although other pitches are also within the scope of the present disclosure.

FIG. 5 is a sectional view of the apparatus 100 shown in FIG. 4 in a subsequent stage of manufacture according to one or more aspects of the present disclosure, in which the photo resist portions 210 and the photoresist layer 220 have been removed, and solder resist portions 410 have been formed by conventional means. The solder resist portions 410 may comprise a heat-resistant coating material, and may aid in protecting the underlying layers. Thus, the apparatus 100 in FIG. 5 may be package substrate having conductive traces 154 and protrusion bump pads 154 are formed.

Figure 7:
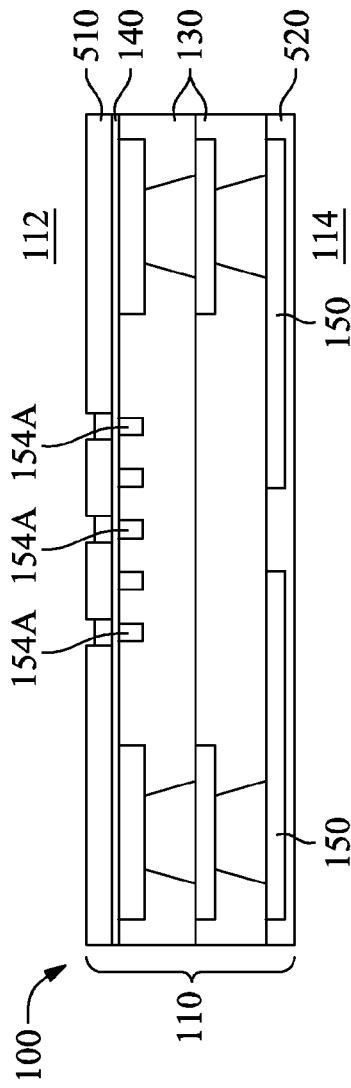
FIG. 7 is a sectional view of the apparatus shown in FIG. 6 in a subsequent stage of manufacture according to one or more aspects of the present disclosure.
Figure 8:
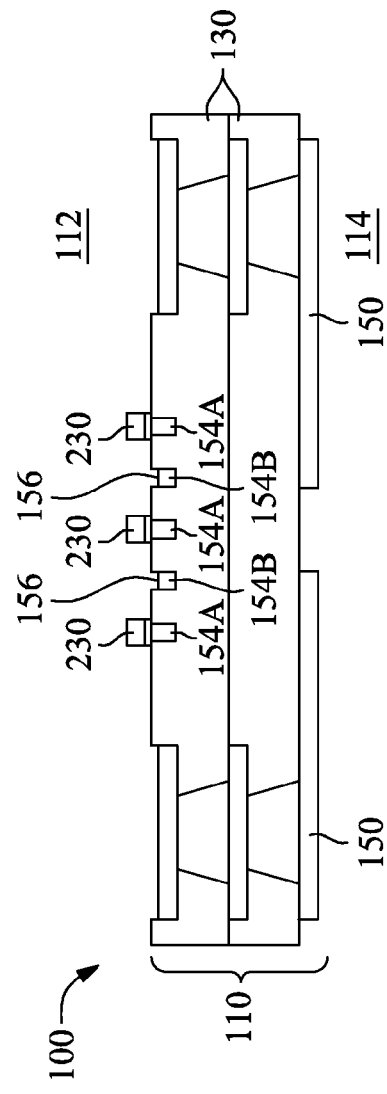
FIG. 8 is a sectional view of the apparatus shown in FIG. 7 in a subsequent stage of manufacture according to one or more aspects of the present disclosure.

Other methods of forming the protrusion bump pads 230 and recessed surfaces 156 of conductive traces 154 are also within the scope of the present disclosure. One such example is depicted in FIGS. 6-8. FIG. 6 is a sectional view of the apparatus 100 shown in FIG. 2 in a subsequent stage of manufacture according to one or more aspects of the present disclosure. As above, the build-up layers 110 have been removed from the carrier substrate 120. A photoresist layer may then be coated, exposed, and developed on one or both sides of the build-up layers 110. For example, photoresist portions 510 may be formed on the first side 112 of the build-up layers 110, and a photoresist layer 520 may substantially cover the second side 114 of the build-up layers 110. The photoresist portions 510 on the first side 112 of the build-up layers 110 may substantially cover the entire first side 112, including over portions 154B of conductive traces 154, except for over portions 154A of conductive traces 154, which remain exposed for subsequent processing.

FIG. 7 is a sectional view of the apparatus 100 shown in FIG. 6 in a subsequent stage of manufacture according to one or more aspects of the present disclosure, in which the photoresist portions 510 have been utilized as a mask during a metallization process. The metallization process is utilized to add metal to the exposed portions 154A of conductive traces 154. The material added by the metallization process may comprise one or more of copper, titanium, aluminum, nickel, gold, alloys and/or combinations thereof, and/or other materials. The metallization may be formed by electroplating, electro-chemical plating, electroless plating, CVD, epitaxial growth, and/or other processes, and may add material to the exposed portions 154A to a thickness ranging between about five microns and about 50 microns, although other thicknesses are also within the scope of the present.

FIG. 8 is a sectional view of the apparatus 100 shown in FIG. 7 in a subsequent stage of manufacture according to one or more aspects of the present disclosure, in which the photoresist portions 510 and the photoresist layer 520 have been removed. FIG. 8 also reflects the result of an etching process selective to the interconnect structures 150, conductive traces 154 (both portions 154A and 154B), and the outermost metallization layer 140. For example, the outermost metallization layer 140 is removed down to the outermost dielectric layer 130, including to a degree sufficient to recess the exposed surface 156 of portions 154B of conductive traces 154 within the outer surface of the outermost dielectric layer 130. As above, the exposed surface 156 of portions 154B of conductive traces 154 forms a portion of a recessed trace, whereas the now protruding portion of portions 154A of conductive traces 154 forms a protrusion bump pad 230. The tops of the interconnect structures 150 and bump pads 230 (the protruding portion over conductive traces 154) are also etched back during this process. Therefore, the process step of adding metallization, illustrated in FIG. 7, should be adjusted to ensure that sufficient height of the protruding pillars remains, even after this subsequent etch step. Additional processing may ensue, such as to form solder resist portions and/or otherwise arrive at the embodiment depicted in FIG. 5.

Figure 9:
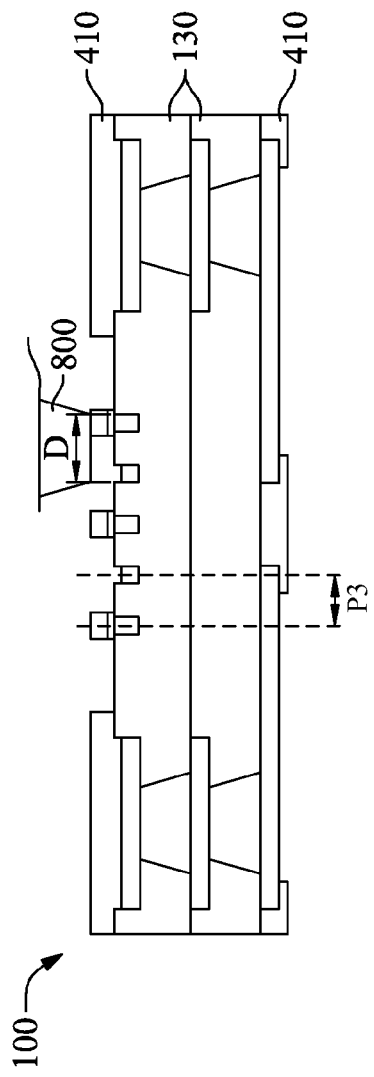
FIG. 9 is a sectional view of the apparatus shown in FIG. 5 in a subsequent stage of manufacture according to one or more aspects of the present disclosure.

FIG. 9 is a sectional view of the apparatus 100 shown in FIG. 5 in which a testing probe 810 has been brought into contact with one of the protrusion bump pads 230 on conductive traces 154. The tip of the testing probe 810 may have a diameter D, which may be substantially greater than the pitch P3 of conductive traces 154. For example, the pitch P3 may be less than about 30 µm, and the testing probe 810 may have a tip diameter D of about 30 µm, if not significantly larger. However, because portions of conductive traces 154 are recessed, they are not shorted by misalignment of the testing probe 810 relative to bump pads 230.

Figure 10:
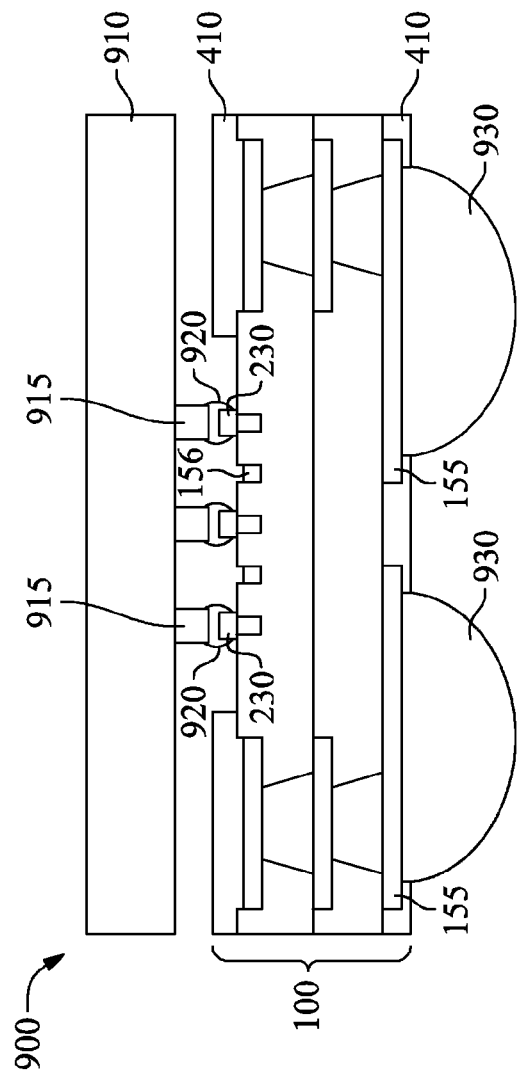
FIG. 10 is a sectional view of the apparatus shown in FIG. 5 in a subsequent stage of manufacture according to one or more aspects of the present disclosure.

FIG. 10 is a sectional view of at least a portion of an apparatus 900 according to one or more aspects of the present disclosure. The apparatus 900 includes the apparatus 100 shown in FIG. 5, a die 910, and a plurality of conductive bumps 920 coupled between the integrated circuit chip and corresponding ones of the bump pads. The die 910 may be or comprise one or more integrated circuit chips, packages, and the like. The conductive bumps 920 may comprise solder, gold, conductive paste, and/or other electrically conductive materials. The die 910 may comprise pads 915 configured to be aligned with the protrusion bump pads 230 prior to be coupled by the conductive bumps 920. Conductive traces 154 may connect protrusion bump pads 230 to interconnect structures 150 (see e.g., FIG. 1B). Furthermore, connectors 930 (e.g., BGA balls) may be disposed on bond pads 155. Connectors 930 may electrically connect apparatus 100 to other device features such as other package substrates, interposers, device dies, printed circuit boards, and the like.

Other embodiments having recessed traces and methods of forming thereof are also within the scope of the present disclosure. For example, FIGS. 11-24 illustrate cross-sectional views of a manufacture of an apparatus 1000 in accordance with some embodiments. Generally, FIGS. 11-24 illustrate a process in which a coreless substrate is formed having embedded traces and bump pads having a height greater than the embedded traces. While FIGS. 11-24 illustrate a process using double-sided processing techniques for illustrative purposes, other embodiments may utilize single-sided processing techniques.

Referring first to FIG. 11, a carrier substrate 120 is provided. Carrier substrate 120 includes a core 124 having conductive layers 122 formed on opposing sides of core 124. As discussed in greater detail below, conductive layer 122 acts as a seed layer for an electroplating process to form conductive traces and pads. Core 124 may be any suitable carrier substrate, such as an organic core substrate comprising epoxy-impregnated glass-fiber laminate, polymer-impregnated glass-fiber laminate, prepreg or ajinomoto build-up film (ABF), paper, glass fiber, non-woven glass fabric, and the like, for example. Alternatively, core 124 may comprise other materials, such as, stainless steel, glass, and the like. Core 124 may provide temporary structural support during the formation of various build-up layers in subsequent process steps.

Conductive layers 122 comprising a conductive material (e.g., copper) are formed on opposing surfaces of core 124. Conductive layers 122 are formed using any suitable process. For example, when core 124 comprises an organic core material, conductive layers 122 may be formed by laminating a conductive foil (e.g., copper foil) on opposing sides of core 124. As another example, conductive layers 122 may be formed using plating or sputtering processes when core 124 comprises stainless steel, glass, and the like. Other methods for forming conductive layers 122 may also be used.

FIG. 12 illustrates formation of patterned mask layers 1002 on conductive layers 122 in accordance with some embodiments. In some embodiments, patterned mask layers 1002 comprise a photoresist material that has been coated or laminated over the surface, exposed in accordance with the desired pattern, and developed to include openings 1004, which expose portions of conductive layer 122. The pattern of exposed portions of conductive layer 122 corresponds to the pattern of bump pads (e.g., bump pads 1006 in FIG. 13) to be used for electrically connecting to other device features (e.g., other device dies).

For example, FIG. 13 illustrates the device after bump pads 1006 have been formed overlying conductive layers 122 in accordance with some embodiments. Bump pads 1006 may be formed by, for example, depositing a seed layer (not shown) in openings 1004 (see FIG. 12) and electro-plating a conductive material using the patterned mask layer 1002 (see FIG. 12) to define the shape of bump pads 1006. In some embodiments, bump pads 1006 may comprise a different material than conductive layer 122, and the material of bump pads 1006 may be selected so that conductive layer 122 may be selectively etched without significantly etching bump pads 1006 in subsequent process steps (see e.g., FIG. 22A). For example, when conductive layer 122 comprises copper, bump pads 1006 may be formed of nickel, tin, or other suitable conductive materials. Bump pads 1006 may have a height H of about 0.5 µm to about 10 µm, for example.

Also shown in FIG. 13 is the removal of patterned mask layers 1002. For example, a plasma ashing and/or wet strip process may be used to remove patterned mask layers 1002. Optionally, the plasma ashing process may be followed by a wet dip in a sulfuric acid ($H_2SO_4$) solution to clean apparatus 1000 and remove remaining mask material.

FIG. 14 illustrates formation of other patterned mask layers 1008 on conductive layer 122 and bump pads 1006. In some embodiments, patterned mask layers 1008 comprise a photoresist material that has been coated or laminated over the surface, exposed in accordance with the desired pattern, and developed to include openings 1010/1010', which expose portions of bump pads 1006 as well as conductive layer 122. The pattern of exposed portions of conductive layers 122 and bump pads 1006 corresponds to the pattern of conductive features in the completed apparatus 1000. For example, openings 1010 may be used to pattern conductive traces while openings 1010' may be used to pattern contact pads for metallization layers. In such embodiments, widths of openings 1010' for contact pads may be greater than widths of openings 1010 for conductive traces. For example, widths of openings 1010 is between about 2 µm to about 30 µm while widths of openings 1010' is between about 30 µm to about 150 µm. In alternative embodiments, openings 1010 and 1010' may have different dimensions. Wider openings for the formation of contact pads may be used to accommodate the formation of various metallization layers 140 in subsequent process steps (see e.g., FIG. 19).

FIG. 15 illustrates the device after openings 1010/1010' are filled with a conductive material. For example, conductive traces 1012 have been formed on bump pads 1006/conductive layer 122, and contact pads 1014 have been formed overlying conductive layer 122. Conductive traces 1012 and contact pads 1014 may be formed by, for example, electro-plating a conductive material using the patterned mask layer 1008 (see FIG. 14) as a mask. In some embodiments, conductive traces 1012/contact pads 1014 may comprise a same material (e.g., copper) as conductive layer 122, and conductive layer 122 may be used as a seed layer for forming conductive traces 1012 and contact pads 1014. In a top down view of apparatus 1000 (see e.g., FIG. 22B), individual conductive traces 1012 may be physically and electrically connected to contact pads 1014, and in subsequent process steps various metallization layers 140 may be formed to electrically connect to contact pads 1014 (see e.g., FIG. 19).

Also shown in FIG. 15 is the removal of patterned mask layers 1008. For example, a plasma ashing and/or wet strip process may be used to remove patterned mask layers 1008. Optionally, the plasma ashing process may be followed by a wet dip in a sulfuric acid ($H_2SO_4$) solution to clean apparatus 1000 and remove remaining mask material.

FIG. 16 illustrates the formation of dielectric layers 130 overlying and between contact pads 1014, conductive traces 1012, bump pads 1006, and conductive layer 122. Dielectric layers 130 may comprise a prepreg (e.g., e.g., FR4 epoxy resin, M6 epoxy resin, and the like) or ABF. Alternatively, or additionally, the dielectric layers 130 may comprise paper, glass fiber, and/non-woven glass fabric, one or more of which may be applied by lamination. For example, a vacuum laminator may be used to dispose a dielectric material on core 124, and an oven curing process may be applied to adhere dielectric layers 130 to contact pads 1014, conductive traces 1012, bump pads 1006, and conductive layer 122. As another example, a hot press process may apply the dielectric material to contact pads 1014, conductive traces 1012, bump pads 1006, and conductive layer 122 under suitable heat and/or pressure conditions for a suitable duration (e.g., one to two hours) to form dielectric layers 130.

Alternatively, or additionally, dielectric layers 130 may comprise silicon dioxide, silicon nitride, silicon oxynitride, an oxide, a nitrogen containing oxide, aluminum oxide, lanthanum oxide, hafnium oxide, zirconium oxide, hafnium oxynitride, a combination thereof, and/or other materials. Dielectric layers 130 may be formed by sputtering, spin-on coating, CVD, low-pressure CVD, rapid thermal CVD, atomic layer CVD, and/or plasma enhanced CVD, perhaps utilizing tetraethyl orthosilicate and oxygen as a precursor. Dielectric layers 130 may also be formed by an oxidation process, such as wet or dry thermal oxidation in an ambient environment comprising an oxide, water, nitric oxide, or a combination thereof, and/or other processes.

Although FIGS. 14-16 illustrate the formation of dielectric layers 130 after conductive traces 1012/contact pads 1014, an alternative order of formation may be used. For example, in alternative embodiments, dielectric layers 130 may be formed on bump pads 1006 and conductive layers 122 prior to the formation of conductive traces 1012/contact pads 1014. Openings may be patterned in dielectric layers 130 to expose portions of bump pads 1006 and conductive layers 122 using any suitable process such as, laser drilling, a combination of photolithography and etching, and the like. Such openings may then be filled with a conductive material to form conductive traces 1012/contact pads 1014, which may be electrically connected to bump pads 1006 and conductive layers 122. A planarization process may further be used to remove excess materials from a top surface of dielectric layer 130.

Referring next to FIG. 17, dielectric layers 130 may be patterned to include openings 1015 to expose contact pads 1014. The patterning of dielectric layers 130 may include any suitable process such as laser drilling, a combination of photolithography and etching, and the like.

FIG. 18 illustrates the formation of additional conductive features, such as metallization layers 140. Metallization layers 140 (e.g., vias) may be formed in dielectric layer 130 by filling openings 1016 with a conductive material. In an embodiment, the conductive material may be formed by depositing a seed layer on sidewalls of openings 1016. The seed layer (not shown) may be formed of copper, nickel, gold, any combination thereof and/or the like. Once the seed layer has been deposited in the opening, a conductive material, such as tungsten, titanium, aluminum, copper, any combinations thereof and/or the like, is filled into the opening, using, for example, an electrochemical plating process. The conductive material may overfill openings 1016, and excess materials (e.g., excess conductive materials) are removed from surfaces of dielectric layer 130. In some embodiments a planarization process, such as a CMP process, mechanical grinding process, or other etch-back technique is used to remove the excess materials, thereby forming metallization layers 140 in dielectric layer 130.

Additional metallization layers 140 (e.g., lines) may be formed overlying dielectric layer 130. For example, a patterned photoresist (not shown) may be formed on dielectric layer 130. Openings in the patterned photoresist may be used to define a shape of such metallization layers 140. Such openings may be filled with a conductive material, for example, by first depositing a seed layer (not shown) on bottom surfaces and/or sidewalls of such openings and filling the openings using an electrochemical plating process. The patterned photoresist may then be removed.

Figure 19:
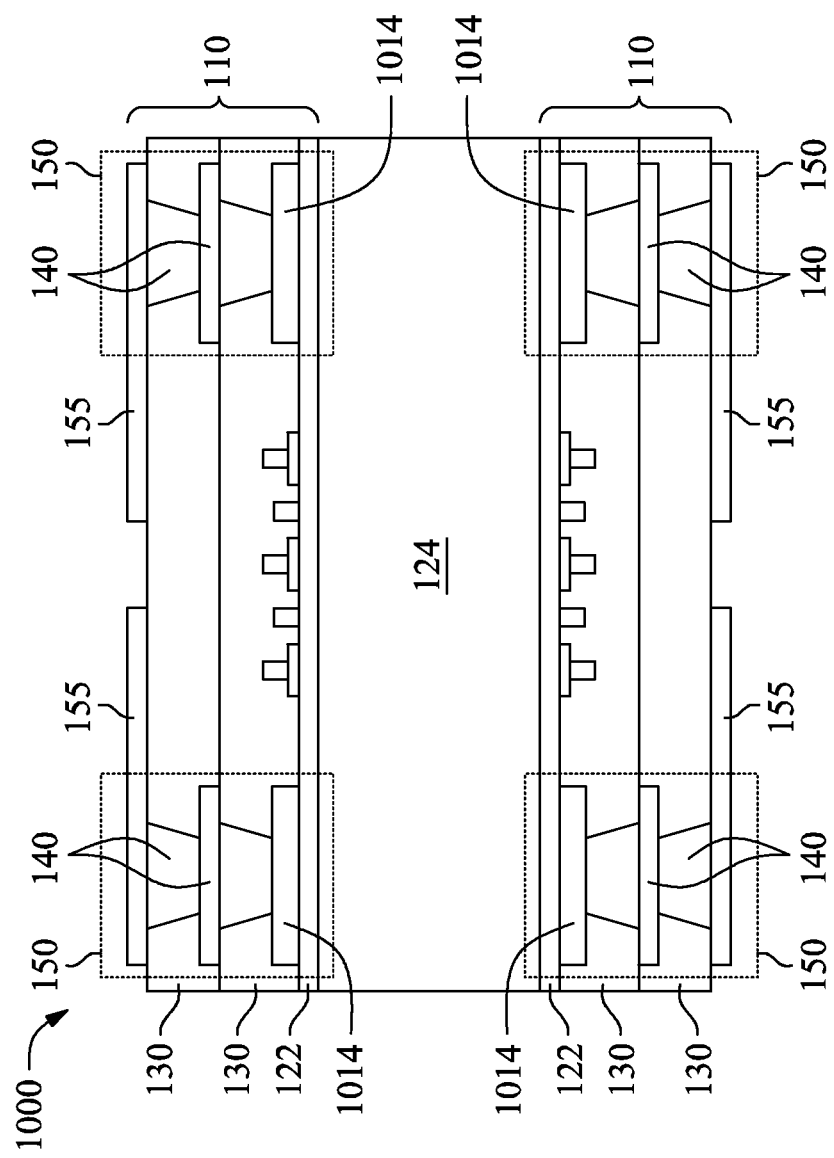

Subsequently, additional dielectric layers 130 and metallization layers 140 may be formed. An example resulting structure is illustrated in FIG. 19. The various metallization layers 140 may form interconnect structures 150 extending form contact pads 1014. Thus, build-up layers 110 are formed on opposing sides of core 124. Build-up layers 110 may include dielectric layers 130, metallization layers 140, bump pads 1006, conductive traces 1012, and contact pads 1014. Bond pads 155 may further be disposed on metallization layer 140. Although a particular number of dielectric layers 130 and conductive features (e.g., metallization layers 140, bump pads 1006, conductive traces 1012, contact pads 1014, etc.) are illustrated, any number of such dielectric layers and/or conductive features may be included in apparatus 1000 depending on device design.

Figure 20:
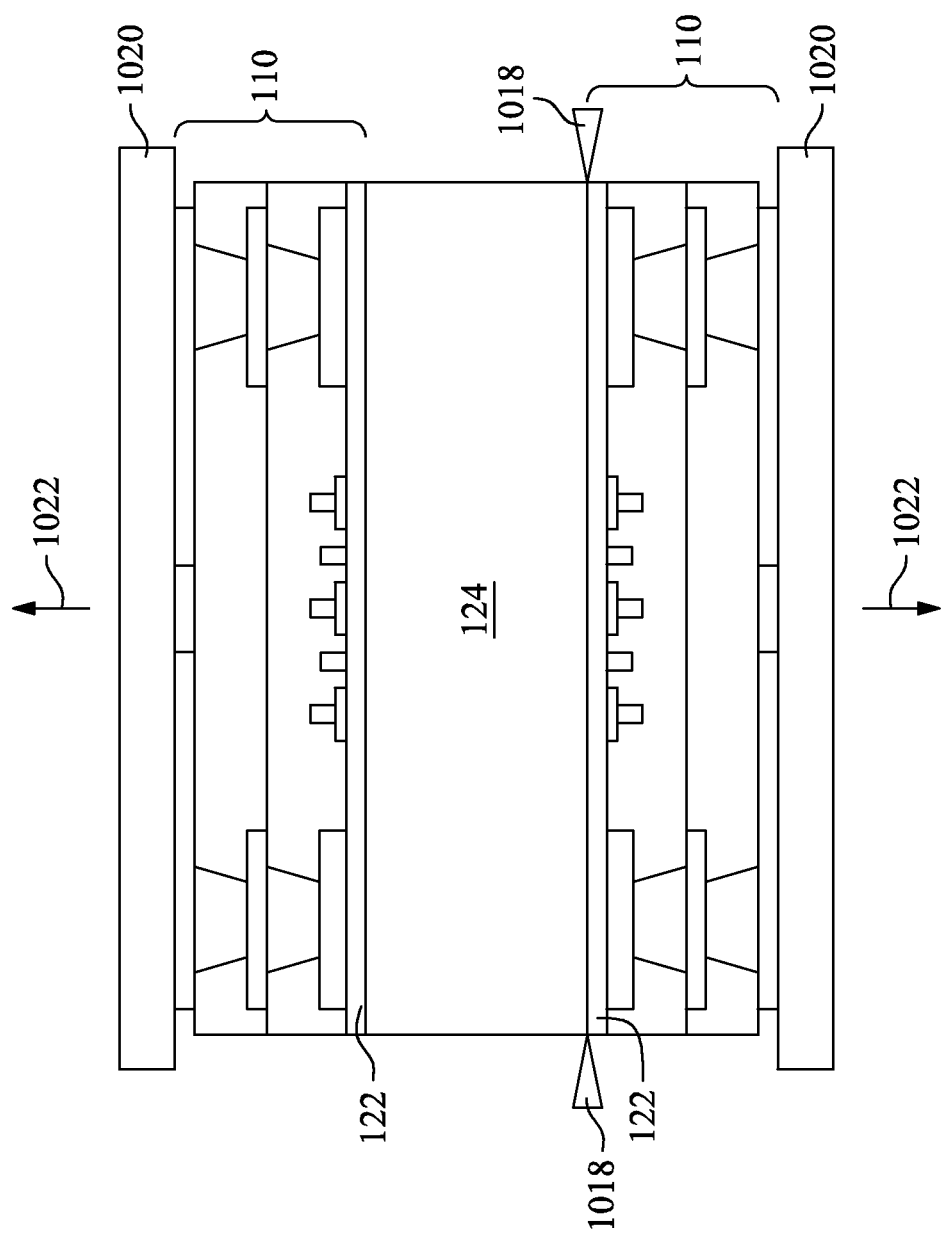
Figure 21:
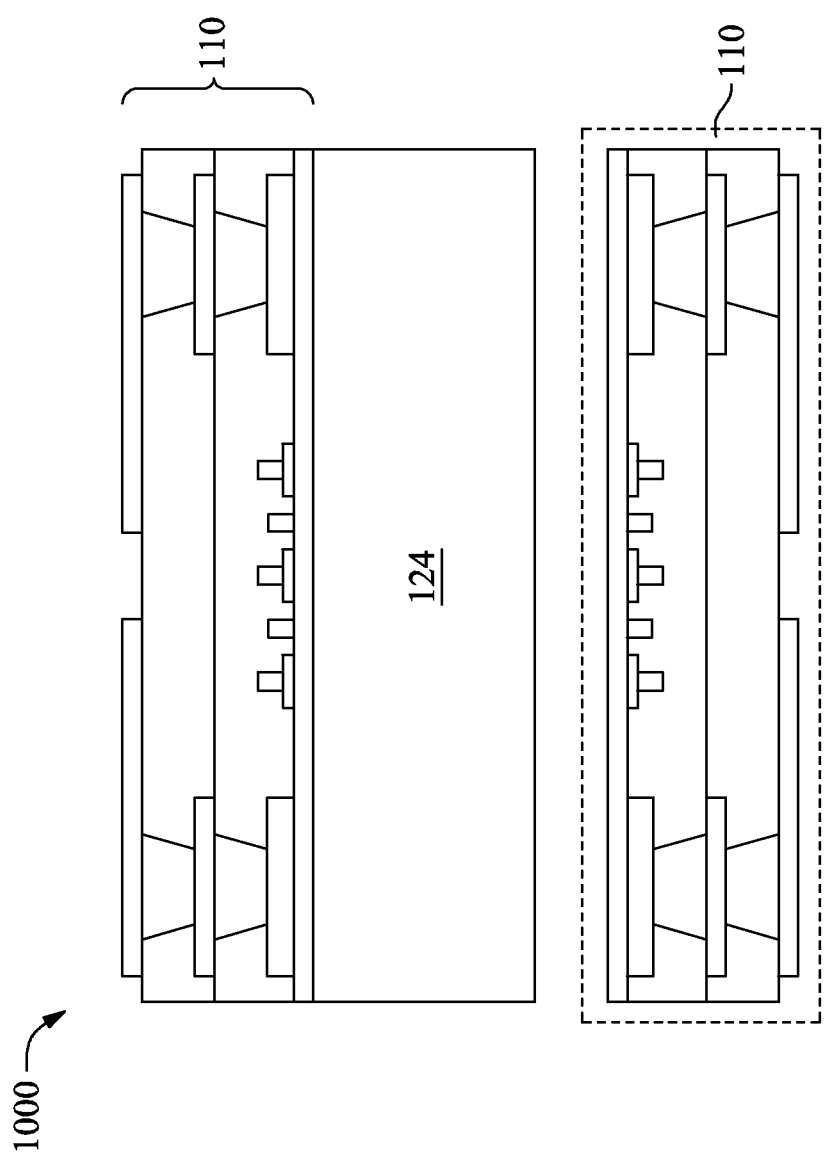

FIGS. 20 and 21 illustrate the removal of build-up layers 110 from core 124. For example, a section of build-up layers 110 underlying core 124 may be removed. In some embodiments, build-up layers 110 are removed using mechanical force. For example, referring to FIG. 20, mechanical tools 1018 are wedged between core 124 and a conductive layer 122. Mechanical tools 1018 create a separation between core 124 and conductive layer 122 at edge portions of core 124. Next, vacuum clamps 1020 may be used to apply mechanical force to opposing sides of core 124. Vacuum clamps 1020 may apply mechanical force in opposing directions (as indicated by arrows 1022), and the mechanical force physically separates build-up layers 110 from core 124.

In some embodiments, build-up layers 110 may be separated from core 124 without significantly damaging other features in the illustrated structure due the relatively weak adhesive bond between core 124 and conductive layers 122. For example, conductive layers 122 may be applied to core 124 using a relatively weak lamination process (e.g., without undergoing an extensive cure). The weakness of the bond between core 124 and conductive layer 122 may further be exploited by the separation of core 124 and conductive layer 1222 at edge portions due to the application of mechanical tools 1018. Thus, build-up layers 110 may be removed from core 124 as illustrated by FIG. 21. The section of build-up layers 110 above core 124 may also be removed using a similar process. Other process for removing build-up layers 110, such as routing, melting, etching, and/or other processes may also be used.

Figure 22A:
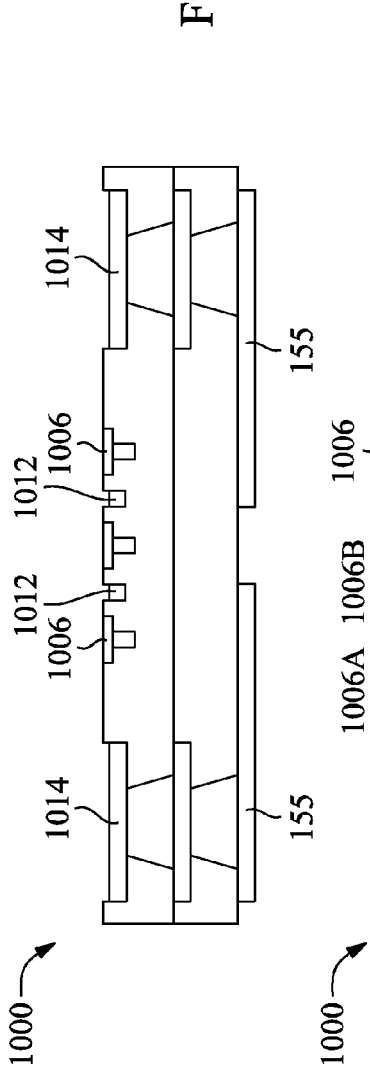
Figure 22B:
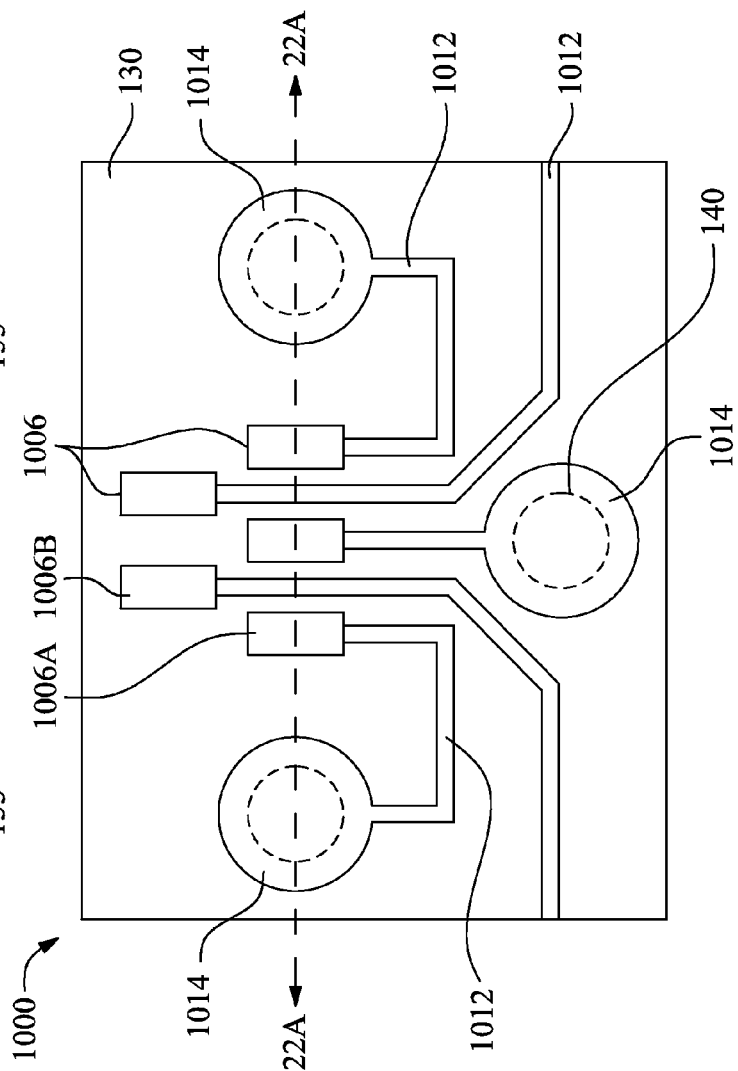

FIGS. 22A and 22B illustrate cross sectional and top down views of the apparatus 1000 shown in FIG. 21 in a subsequent stage of manufacture where conductive layer 122 has been removed. The cross sectional view of FIG. 22A may be taken across line 22A-22A illustrated in FIG. 22B. One of the sections of build-up layers 110 from FIG. 21 is not shown in FIGS. 22A and 22B, although this is merely for the sake of simplifying the following discussion, and a person having ordinary skill in the art will readily recognize that both sections of the build-up layers 110 may be processed according to one or more of the aspects of the present disclosure.

Referring first to FIG. 22A, conductive layer 122 (see FIG. 17) may be removed using a suitable etching process, for example. The etching of conductive layer 122 may further etch portions of conductive traces 1012 not covered by bump pads 1006 as well as contact pads 1014. For example, the etching conductive layer 122 may use a suitable chemical etchant that selectively removes the material of conductive layer 122 and conductive traces 1012/contact pads 1014 (e.g., copper) without significantly removing the material of bump pads 1006 (e.g., nickel, tin, and the like). The suitable chemical etchant may have a high etch selectivity between the materials of conductive layer 122 (and conductive traces 1012/contact pads 1014) and bump pads 1006. In some embodiments, suitable chemical etchants include a sulfuric acid ($H_2SO_4$) or hydrogen peroxide ($H_2O_2$) based chemical etchant, for example, and bump pads 1006 may act as a etch stop layer or hard mask during the etching of conductive layer 122. Thus, exposed surfaces of conductive traces 1012 and contact pads 1014 may be recessed from a top surface of dielectric layer 130 in apparatus 1000. As further illustrated by FIG. 22A, bump pads 1006 may be substantially level with a top surface of dielectric layer 130.

Referring to FIG. 22B, bump pads 1006 may be electrically connected to conductive traces 1012, which may be electrically connected to contact pads 1014 and metallization layers 140 (shown in ghost). Bump pads 1006 may cover at least a portion of conductive traces 1012. Exposed portions of conductive traces 1012 may be recessed during the removal of conductive layer 122. Bump pads 1006 may be used to electrically connect apparatus 1000 to other device features such as other package substrates, interposers, device dies, printed circuit boards, and the like. The recessing of various exposed conductive traces 1012 reduces manufacturing defects (e.g., solder bridges) during the bonding of such other device features to bump pads 1006. Furthermore, bump pads 1006 on adjacent conductive traces 1012 may not be laterally aligned. For example, in FIG. 22B, bump pads 1006A and 1006B may not intersect any common lines (e.g., line 22A-22A). Alternatively, bump pads 1006 on at least a subset of adjacent conductive traces 1012 may be laterally aligned. That is, bump pads 1006 and conductive traces 1012 may be disposed in any configuration depending on device design.

Additional processing may ensue, such as to form solder resist portions (e.g., solder resist portions 410 exposing bond pads 155 and bump pads 1006) as illustrated by FIG. 23. Furthermore, in some embodiments, a testing probe may be applied to apparatus 1000, such as testing probe 810 of FIG. 9. Because bump pads 1006 are not recessed from a top surface of dielectric layer 130, the testing probe may more reliably contact and test the electrical connections of bump pads 1006.

FIG. 24 is a sectional view of at least a portion of an apparatus 1200 according to one or more aspects of the present disclosure. The apparatus 1200 includes the apparatus 1000 shown in FIG. 23, a die 1100, and a plurality of conductive bumps 1120 coupled between the integrated circuit chip and corresponding ones of bump pads 1006. Because bump pads 1006 are not recessed in apparatus 1000, physical connection between conductive bumps 1120 and bump pads 1006 may be made with increased reliability. The die 1100 may be or comprise one or more integrated circuit chips, packages, and the like. The conductive bumps 1120 may comprise solder, gold, conductive paste, and/or other electrically conductive materials. The die 1100 may comprise pads 1115 configured to be aligned with the bump pads 1106 prior to be coupled by the conductive bumps 1120. In some embodiments, conductive bumps 1120 may not be in direct physical contact with conductive traces 1012 due to the recessing of exposed portions of conductive traces 1012. Additional external connectors (e.g., bumps 1210 comprising solder, gold, conductive paste, and the like) may further be disposed on bond pads 155. Bumps 1210 may be used to electrically connect apparatus 1200 to other device features, such as, other device dies, interposers, printed circuit boards, package substrates, and the like (not shown).

Figure 25:
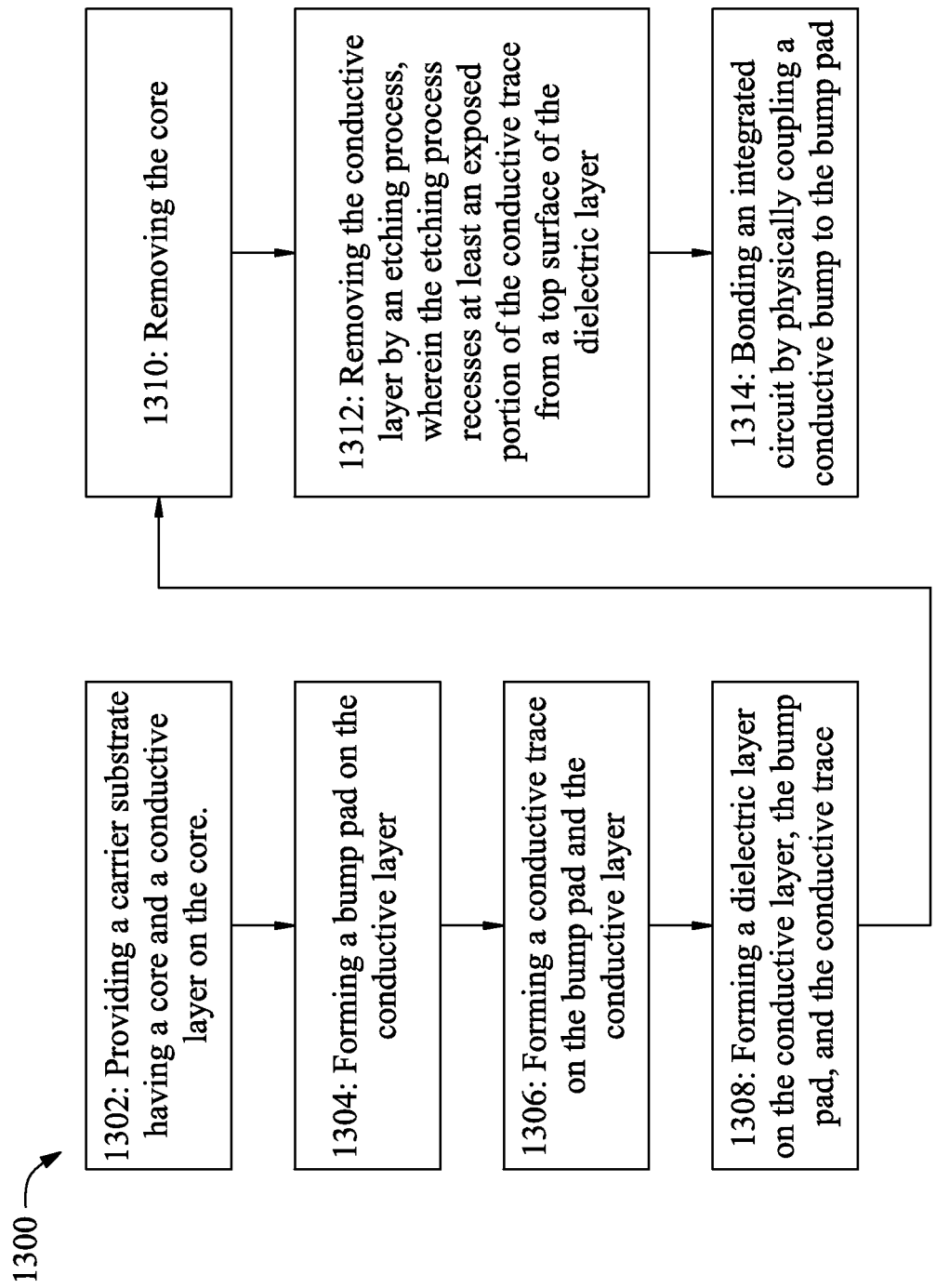
FIG. 25 is a process flow for manufacturing a device in accordance with some embodiments.

FIG. 25 illustrates a process flow 1300 for forming an apparatus (e.g., apparatus 1200) in accordance with some embodiments. Process flow 1300 may start with step 1302 where a carrier substrate (e.g., carrier substrate 120) is provided. The carrier substrate may include a core (e.g., core 124) and a conductive layer (e.g., conductive layer 122) on the core. In some embodiments, the core may be an organic core having laminated conductive layers disposed on opposing sides. Other embodiments the conductive layer may be disposed on only one side of the core. In step 1304, bump pads (e.g., bump pads 1006) are formed on the conductive layer. The bump pads and the conductive layer may comprise different conductive materials. In some embodiments, the conductive layer may comprise a material that can be selectively etched without significantly etching the bump pads. For example, the conductive layer may comprise copper while the bump pads may comprise nickel, tin, and the like.

Next in step 1306, a conductive trace (e.g., conductive trace 1012) is formed on the bump pad and the conductive layer. The conductive trace and the conductive layer may comprise the same conductive materials (e.g., copper). In step 1308, a dielectric layer (e.g., dielectric layer 130) is formed on the conductive layer, the bump pad and the conductive trace. Additional conductive features may also be formed, such as additional dielectric layers and/or conductive features (e.g., contact pads, conductive pillars, conductive traces, bump pads, and the like).

After the formation of various features, the core is removed in step 1310. In step 1312, the conductive layer is removed using an etching process. The etching process may further recess at least a portion of the conductive trace from a top surface of the dielectric layer. For example, exposed portions of the conductive trace (i.e., portions of the conductive trace not covered by the bump pad) may be removed. The etching process may use a chemical etchant that has a sufficiently high etch selectivity between the materials of the conductive trace/conductive layer (e.g., copper) and the bump pad (e.g., nickel, tin, and the like). Thus, the etching process may not significantly etch the bump pads, and after etching top surfaces of the bump pads and the dielectric layer may be substantially level. Finally, in step 1314, another device feature (e.g., integrated circuit chip 1100) may be bonded by physically coupling a conductive bump (e.g., conductive bump 1120) to the bump pad. In some embodiments, no conductive bumps may be physically coupled to exposed surfaces of the conductive trace.

In an aspect of various embodiments, a protrusion bump pad (e.g., protrusion bump pad 230) and underlying conductive traces (e.g., conductive traces 154) may have any suitable shape, dimension, and/or configuration. For example, FIGS. 26A-26C illustrate varying views of conductive traces 154 and corresponding protrusion bump pads 230. Referring first to FIG. 25A, a top down view of conductive traces 154 and conductive bump pads 230 is provided. Also provided is a top down view of a conductive bump 920, which may electrically connect protrusion bump pads 230 (and apparatus 100) to another die, such as pads 915 of die 910 (see e.g., FIGS. 26B and 26C).

Protrusion bump pads 230 may be disposed on conductive trace pad portions 154C of conductive traces 154. Conductive trace pad portions 154C may be wider than other portions of conductive traces 154. For example, conductive trace 154 may generally have a width S1 of about 10 μm while a width S6 of conductive trace pad portions 154C may be about 20 μm. Furthermore, in some embodiments, the spacing between adjacent conductive traces 154 may generally have a dimension S2 (e.g., about 15 μm), which may be smaller than dimensions S4 of the spacing between adjacent conductive trace pad portions 154C (e.g., about 30 μm).

In the illustrated embodiment, both protrusion bump pads and underlying conductive trace pad portions 154C comprise an oblong shape. For example, both lengthwise dimensions of protrusion bump pads 230 (e.g., dimension of a lengthwise, i.e., long, axis 230A) and conductive trace pad portions 154C (e.g., dimension S5 in FIG. 26A) may be larger than corresponding widthwise dimensions of protrusion bump pads 230 (e.g., dimension of a widthwise, i.e., short, axis 230B) and conductive trace pad portions 154C (e.g., dimension S6 of FIG. 26A). In some embodiments, lengthwise dimensions S5 of conductive trace pad portions 154C may be about 60 µm, and widthwise dimensions S6 of conductive trace pad portions 154C may be about 20 µm, for example. As another example, dimensions of lengthwise axis 230A may be about 50 µm, and dimensions of widthwise axis 230B may be about 20 µm. Furthermore, lengthwise (labeled line 26B/26B) and widthwise axes (labeled line 26C/26C) of conductive bump 920 may be aligned with corresponding lengthwise and widthwise axes of protrusion bump pad 230. In some embodiments, dimensions of the lengthwise axis of conductive bump 920 may be about 53 µm, and dimensions of the widthwise axis of conductive bump 920 may be about 45 µm, for example. In alternative embodiments, various features and spacing between features illustrated in FIG. 26A may have different dimensions.

FIG. 26B illustrates a sectional view of a conductive trace 154, protrusion bump pad 230, and conductive bump 920 taken along lines 26B/26B in FIG. 26A. As illustrated in FIG. 26B, portions conductive traces 154 not covered by protrusion bump pads 230 may have a recessed, exposed surface 156. For example, recessed, exposed surface 156 may be lower than a top surface of an outermost dielectric layer 130 in apparatus 100. FIG. 26C illustrates an different sectional view of a conductive trace 154, protrusion bump pad 230, and conductive bump 920 taken along lines 26C/26C in FIG. 26A. As illustrated by FIG. 26C, conductive bump 920 may contact a top surface and at least some sidewalls of protrusion bump pads 230 for improved electrical connection and bond strength (e.g., due to the increased contact area between protrusion bump pads 230 and conductive bump 920).

FIGS. 27A-27D illustrate varying views of conductive traces 154 and protrusion bump pads 230 in accordance with some alternative embodiments. FIGS. 27A and 27B illustrate top down views of conductive traces 154 and protrusion bump pads 230. In the illustrated embodiments, protrusion bump pads 230 may have a substantially symmetrical shape (e.g., circular). Lengthwise and widthwise axes 230A and 230B of protrusion bump pad 230 may have substantially equal dimensions. In some embodiments, a ratio of the dimension of lengthwise axis 230A to the dimension of widthwise axis 230B (or vice versa) may be about 0.8 to about 1.2. It has been observed that in embodiments where the ratio of lengthwise and widthwise axes of protrusion bump pads 230 is within this range, stress conditions of the bonded package (e.g., apparatus 100 bonded to die 910) are improved. For example, in a simulation, a top most dielectric layer of die 910 (see FIGS. 27C-27D) bonded to a symmetrical protrusion bump pads 230 (having lengthwise and widthwise axes of a substantially equal size) may experience about 27% lower stress than similar dielectric layers in dies bonded to protrusion bump pads 230 having oblong dimensions (see e.g., FIG. 26A-26C).

Furthermore, in the bonded package, conductive bump 920 may or may not be aligned with protrusion bump pad 230. For example, FIG. 26A illustrates an embodiment where lengthwise and widthwise axes 920A and 920B, respectively, of conductive bump 920 are aligned (e.g., substantially parallel) with corresponding lengthwise and widthwise axes 230A and 230B, respectively, of protrusion bump pads 230. As another example, FIG. 26B illustrates another embodiment where lengthwise and widthwise axes 920A and 920B, respectively, of conductive bump 920 are not aligned (e.g., intersecting) with corresponding lengthwise and widthwise axes 230A and 230B, respectively, of protrusion bump pads 230. Because conductive bumps 920 may be configured in any orientation with respect with protrusion bump pads 230, increased flexibility may be provided for designing features in apparatus 100.

Furthermore, the flexibility of orientation between conductive bumps 920 and protrusion bump pads 230 may be achieved while still disposing conductive bumps 920 on sidewalls of protrusion bump pads 230. For example, as illustrated by the sectional views provided by FIGS. 27C (taken along line 27C/27C of FIG. 27B) and 27D (taken along line 27D/27D of FIG. 27B), conductive bump 920 contacts a top surface and sidewalls of protrusion bump pad 230 even when conductive bump 920 is not aligned with protrusion bump pad 230. This increased routing flexibility (while still maintaining good contact surface area between protrusion bump pads 230 and conductive bumps 920) may be provided at least in part by the substantial similarity of lengthwise and widthwise dimensions of protrusion bump pad 230. In the illustrated embodiments, conductive traces 154 do not have a recessed, exposed surface 156. In alternative embodiments, portions of conductive traces 154 not covered by protrusion bump pads 230 may include a recessed, exposed surface 156.

FIGS. 26A-26C and 27A-27D illustrate embodiments where widthwise dimensions of protrusion bump pad 230 is substantially equal to a width S6 (see FIG. 26A) of conductive trace pad portion 154C. Alternatively, protrusion bump pad 230 may have any dimension relative to conductive trace pad portion 154C. For example, FIG. 28 illustrates three alternative configurations for conductive traces 154 and corresponding protrusion bump pads 230 (labeled 230-1, 230-2, 230-3). As illustrated, the dimensions of widthwise axis 230B of protrusion bump pad 230 may be substantially the same (e.g., protrusion bump pad 230-1), smaller (e.g., protrusion bump pad 230-2), or larger (e.g., protrusion bump pad 230-3) than the width S6 of a corresponding conductive trace pad portions 154C.

Referring next to FIG. 29, the shape of protrusion bump pad 230 need not be circular, or even ovular. For example, protrusion bump pad 230 may have any suitable shape, such as square (e.g., protrusion bump pad 230-4), hexagonal (e.g., protrusion bump pad 230-5), octagonal (e.g., protrusion bump pad 230-6), and the like. In such embodiments, dimensions of lengthwise axis 230A may be substantially equal to dimensions of widthwise axis 230B, which may allow for flexibility in attaching a conductive bump (e.g., conductive bump 920) while still maintaining increased contact surface area for improved electrical connectivity and bonding strength (see e.g., FIG. 27C-27D). For example, a ratio of the dimension of lengthwise axis 230A to the dimension of widthwise axis 230B (or vice versa) may be about 0.8 to about 1.2. In alternative embodiments, protrusion bump pad 230 may have oblong dimensions where dimensions of lengthwise axis 230A may be larger than dimensions of widthwise axis 230B (e.g., as illustrated in FIGS. 26A-26C).

Figure 30:
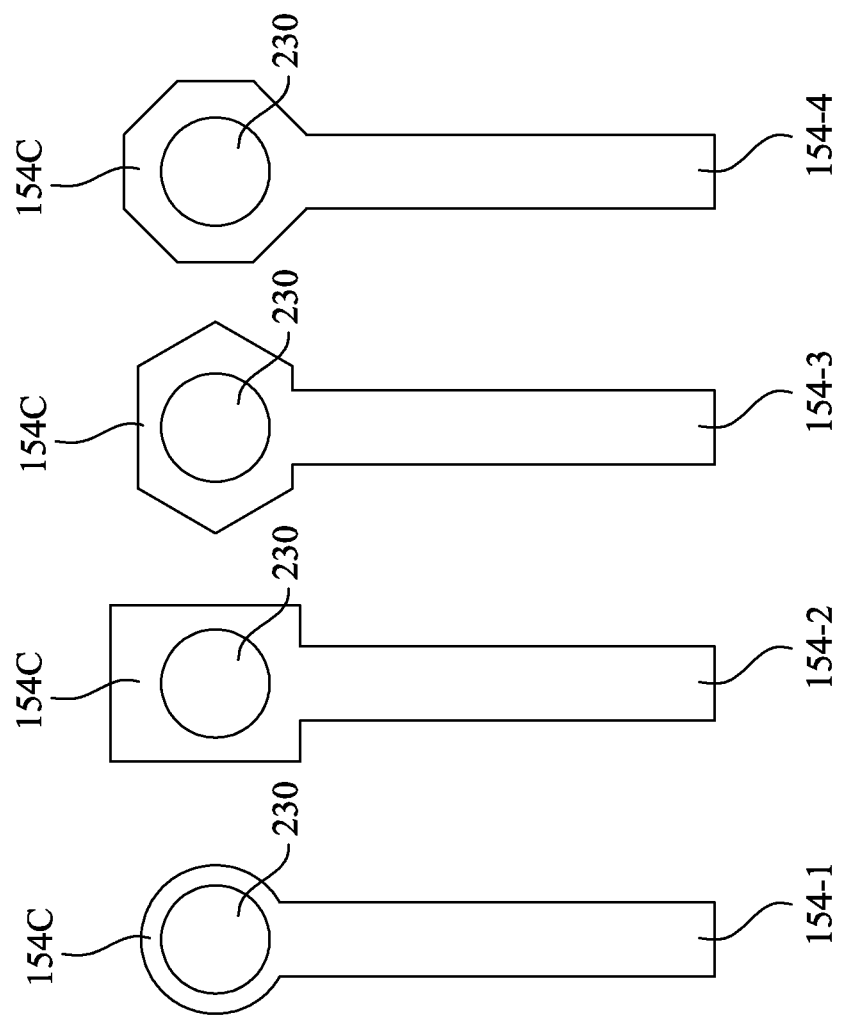

Furthermore, as illustrated by FIG. 30, conductive trace pad portion 154C may have any suitable, such as circular (e.g., conductive trace 154-1), ovular, rectangular (e.g., conductive trace 154-2), hexagonal (e.g., conductive trace 154-3), octagonal (e.g., conductive trace 154-4), and the like. The shapes of protrusion bump pad 230 and conductive trace pad portion 154C may or may not be the same. In various embodiments, any combination shapes for protrusion bump pad 230 (e.g., circular, square, hexagonal, octagonal, and the like) and conductive trace pad portion 154C (e.g., circular, ovular, rectangular, hexagonal, octagonal, and the like) may be used depending on apparatus design.

The various shapes, dimensions, and spacing of protrusion bump pads 230 and/or conductive traces 154 (including conductive trace pad portions 154C) may be formed using the processes described with respect to FIGS. 2-10, above. For example, the shape and/or dimensions of protrusion bump pads 230 may be formed by patterning a corresponding shape/dimension in photoresist portions 210 or 510 of FIGS. 2-10.

Figure 31:
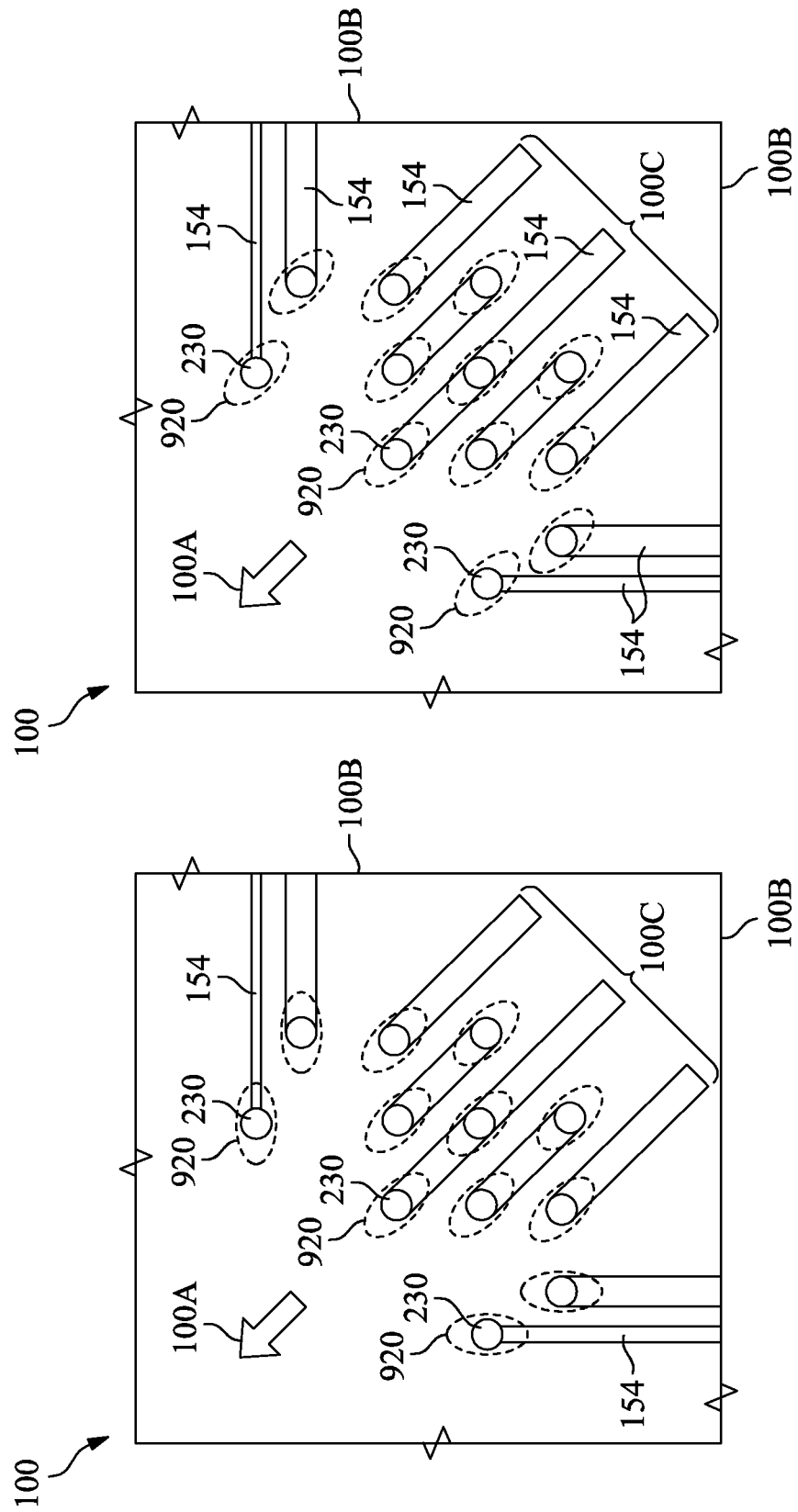

In embodiments where protrusion bump pads 230 have lengthwise and widthwise axes of substantially similar dimensions, any of the following, non-limiting advantages may be provided: increased routing flexibility, decreased stress, reduced cold joint risk at die bonding, and the like. For example, FIGS. 31A and 31B illustrate example layouts for conductive traces 154, protrusion bump pads 230, and conductive bumps 920. In FIGS. 31A and 31B, arrow 100A points to a die center region of apparatus 100, edges 100B correspond to edge region of apparatus 100, and regions 100C correspond to corners of apparatus 100. In the illustrated embodiments, conductive traces in corner regions 100C may be disposed at an angle (e.g., a substantially 45° angle) in relation to edges 100B while conductive traces 154 outside of corner regions 100C may be substantially parallel to edges 100B.

FIG. 31A illustrates an embodiment where conductive bumps 920 are aligned with conductive traces 154. For example, lengthwise axes of conductive bumps 920 may be substantially parallel with conductive traces 154. Thus, lengthwise axes of conductive bumps 920 in corner regions 100C may be disposed at an angle in relation to edges 100B while lengthwise axes of conductive bumps 920 outside of corner regions 100C may be substantially parallel to edges 100B. FIG. 31B illustrates an alternative embodiment where conductive bumps 920 are not aligned with conductive traces 154. For example, lengthwise axes of conductive bumps 920 may be disposed at an angle in relation to conductive traces 154. Thus, lengthwise axes of conductive bumps 920 may be disposed at an angle in relation to edges 100B both inside and outside of corner regions 100C.

Figure 32:
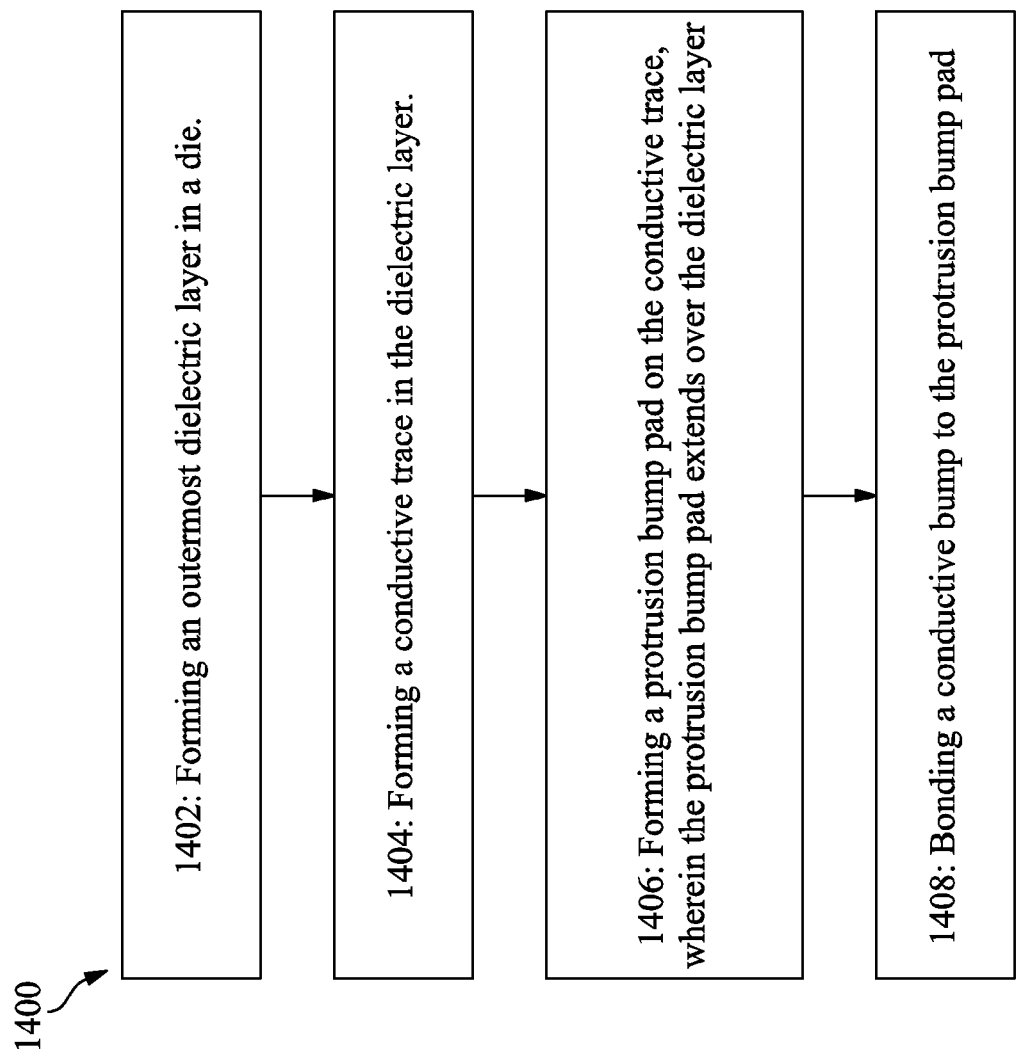
FIG. 32 is a process flow for manufacturing a device in accordance with some embodiments.

FIG. 32 illustrates a process flow 1400 for forming a protrusion bump pad in accordance with some embodiments. In step 1402, an outermost dielectric layer (e.g., outermost dielectric layer 130) of a package substrate (e.g., apparatus 100) is formed. In step 1404, a conductive trace (e.g., conductive trace 154) is formed in the outermost dielectric layer. The conductive trace may include a conductive trace pad portion (e.g., conductive trace pad portion 154c), which may be wider than other portions of the conductive trace. The conductive trace pad portion may be configured in any suitable size and/or shape.

Next, in step 1406, a protrusion bump pad (e.g., protrusion bump pad 230) is formed on the conductive trace (e.g., on the conductive trace pad portion). The protrusion bump pad may extend over a top surface of the outermost dielectric layer. In some embodiments, a ratio of a dimension of a lengthwise axis of the protrusion bump pad to a dimension of the widthwise axis of the protrusion bump pad may be about 0.8 to about 1.2. Furthermore, the protrusion bump pad may be configured in any suitable shape (e.g., circular, square, hexagonal, octagonal, and the like) and/or in any suitable dimension (e.g., having a smaller, larger, or substantially equal width as the conductive trace pad portion).

In step 1408, a conductive bump (e.g., conductive bump 920) is bonded the protrusion bump pad. The conductive bump may bond the die (e.g., apparatus 100) to another die (e.g., die 910). The conductive bump may or may not be aligned with the protrusion bump pad. For example, axes of the conductive bump and the protrusion bump pad may be substantially parallel or intersecting. Furthermore, in some embodiments, the conductive bump may contact a top surface and sidewalls of the protrusion bump pad.

Thus, protrusion bump pads and conductive traces in an apparatus may be configured in any suitable shape and/or size. In some embodiments, protrusion bump pads may have a lengthwise axis and a widthwise axis having substantially equal dimensions. For example, a ratio of the dimension of the lengthwise axis to the dimension of the widthwise axis may be about 0.8 to about 1.2. In such embodiments, increased routing flexibility, decreased stress, reduced cold joint risk at die bonding, and the like may be achieved in the resulting package.

In accordance with an embodiment, an apparatus includes a dielectric layer in a die, a conductive trace in the dielectric layer, and a protrusion bump pad on the conductive trace. The protrusion bump pad at least partially extends over the dielectric layer, and the protrusion bump pad includes a lengthwise axis and a widthwise axis. A ratio of a first dimension of the lengthwise axis to a second dimension of the widthwise axis is about 0.8 to about 1.2.

In accordance with another embodiment, an apparatus includes an outermost dielectric layer of a die, a conductive trace in the outermost dielectric layer, and a protrusion bump pad on the conductive trace. The protrusion bump pad at least partially extends over a top surface of the outermost dielectric layer, and a portion of the conductive trace not covered by the protrusion bump pad is recessed from the top surface of the outermost dielectric layer.

In accordance with yet another embodiment, a method includes forming an outermost dielectric layer in a first die, a conductive trace in the outermost dielectric layer, and a protrusion bump pad on the conductive trace. The protrusion bump pad extends over a top surface of the outermost dielectric layer, and the protrusion bump pad include/s a first lengthwise axis having a first dimension and a widthwise axis having a second dimension, and wherein a ratio of the first dimension to the second dimension is about 0.8 to about 1.2.

The foregoing outlines features of several embodiments so that a person having ordinary skill in the art may better understand the aspects of the present disclosure. A person having ordinary skill in the art should appreciate that they may readily use the present disclosure as a basis for designing or modifying other processes and structures for carrying out the same purposes and/or achieving the same advantages of the embodiments introduced herein. A person having ordinary skill in the art should also realize that such equivalent constructions do not depart from the spirit and scope of the present disclosure, and that they may make various changes, substitutions and alterations herein without departing from the spirit and scope of the present disclosure.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An apparatus, comprising:
a dielectric layer;
a conductive trace in the dielectric layer, wherein the conductive trace comprises:
a conductive line portion having a substantially uniform width in a top-down view of the apparatus; and
a conductive trace pad portion connected to the conductive line portion, wherein the conductive trace pad portion is wider than the conductive line portion in the top-down view of the apparatus; and
a protrusion bump pad disposed on the conductive trace pad portion, wherein a surface of the protrusion bump pad opposite the conductive trace is substantially level, wherein the protrusion bump pad at least partially extends over the dielectric layer, wherein the protrusion bump pad comprises a first lengthwise axis and a widthwise axis, and wherein a ratio of a first dimension of the first lengthwise axis to a second dimension of the widthwise axis is about 0.8 to about 1.2.

2. The apparatus of claim 1, wherein the first dimension is substantially equal to the second dimension.

3. The apparatus of claim 1, wherein the protrusion bump pad is substantially circular, substantially square, hexagonal, or octagonal.

4. The apparatus of claim 1, wherein the conductive trace pad portion is circular, ovular, rectangular, hexagonal, or octagonal.

5. The apparatus of claim 1 further comprising a die bonded to the dielectric layer, wherein the die is disposed on an opposing side of the protrusion bump pad as the conductive trace, and wherein the die comprises a conductive bump, and wherein the conductive bump contacts the protrusion bump pad.

6. The apparatus of claim 5, wherein the conductive bump further contacts a sidewall of the protrusion bump pad.

7. The apparatus of claim 5, wherein a second lengthwise axis of the conductive bump is substantially parallel with the first lengthwise axis of the protrusion bump pad.

8. The apparatus of claim 5, wherein a second lengthwise axis of the conductive bump intersects the first lengthwise axis of the protrusion bump pad.

9. The apparatus of claim 1, wherein the dielectric layer is an outermost dielectric layer of a package substrate.

10. An apparatus comprising:
an outermost dielectric layer of a first apparatus;
a conductive trace in the outermost dielectric layer, wherein an exposed surface of the conductive trace is recessed from a top surface of the outermost dielectric layer; and
a protrusion bump pad forming an interface with the conductive trace, wherein the protrusion bump pad at least partially extends over the top surface of the outermost dielectric layer, and wherein the interface is higher than the exposed surface of the conductive trace.

11. The apparatus of claim 10, wherein the protrusion bump pad comprises a lengthwise axis and a widthwise axis, and wherein a ratio of a first dimension of the lengthwise axis to a second dimension of the widthwise axis is about 0.8 to about 1.2.

12. The apparatus of claim 10 further comprising a die bonded to the first apparatus, wherein the die comprises a conductive bump bonded to an opposing side of the protrusion bump pad as the conductive trace.

13. The apparatus of claim 12, wherein axes of the conductive bump and the protrusion bump pad are substantially parallel.

14. The apparatus of claim 12, wherein axes of the conductive bump and the protrusion bump pad intersect.

15. The apparatus of claim 12, wherein the conductive bump contacts a sidewall of the protrusion bump pad.

16. The apparatus of claim 1, wherein a first width of the conductive trace pad portion is substantially equal to or greater than the second dimension of the widthwise axis of the protrusion bump pad.

17. An apparatus, comprising:
a dielectric layer;
a conductive trace in the dielectric layer, wherein the conductive trace comprises:
a first portion having a top surface lower than a top surface of the dielectric layer; and
a second portion having a top surface substantially level with the top surface of the dielectric layer; and
a bump pad over and contacting the second portion of the conductive trace, wherein the bump pad comprises a first axis and a second axis substantially perpendicular to the first axis, wherein the first axis runs in a same direction as a lengthwise dimension of the conductive trace, and wherein a ratio of a first dimension of the first axis to a second dimension of the second axis is about 0.8 to about 1.2.

18. The apparatus of claim 17 further comprising a die comprising a conductive bump, wherein the conductive bump contacts and extends along sidewalls of the bump pad.

19. The apparatus of claim 18, wherein a lengthwise axis of the conductive bump is substantially parallel with the first axis or the second axis of the bump pad.

20. The apparatus of claim 18, wherein a lengthwise axis of the conductive bump is not substantially parallel with the first axis or the second axis of the bump pad.

* * * * *